(12) United States Patent
Rahim et al.

(10) Patent No.: US 10,636,776 B2
(45) Date of Patent: Apr. 28, 2020

(54) METHODS OF MANUFACTURING RF FILTERS

(71) Applicant: GLOBALFOUNDRIES Inc., Grand Cayman (KY)

(72) Inventors: Md. Sayed Kaysar Bin Rahim, Cohoes, NY (US); Luke England, Saratoga Springs, NY (US); Sukeshwar Kannan, Malta, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 118 days.

(21) Appl. No.: 15/907,413

(22) Filed: Feb. 28, 2018

(65) Prior Publication Data

US 2019/0267361 A1   Aug. 29, 2019

(51) Int. Cl.
*H01L 25/16* (2006.01)
*H03H 3/08* (2006.01)
(Continued)

(52) U.S. Cl.
CPC ........ *H01L 25/16* (2013.01); *H01L 21/76898* (2013.01); *H01L 21/78* (2013.01);
(Continued)

(58) Field of Classification Search
CPC ....... H01L 25/16; H01L 23/481; H01L 21/78; H01L 24/91; H01L 24/08; H01L 24/05; H01L 21/76898; H01L 41/313; H01L 24/94; H01L 2224/80895; H01L 2224/83896; H01L 2224/83047; H01L 2224/83031; H01L 2224/80047; H01L 2224/80031; H01L 24/83; H01L 24/80; H01L 2224/32145; H01L 24/32; H01L 2224/08145; H01L 41/29; H01L 41/332;
(Continued)

(56) References Cited

U.S. PATENT DOCUMENTS 8,178,976 B2   5/2012   Dunne et al.
8,759,950 B2   6/2014   Kamgaing et al.
(Continued)

OTHER PUBLICATIONS

Examination Report from Taiwan Application No. 108103124 dated Dec. 24, 2019.

*Primary Examiner* — Robert J Pascal
*Assistant Examiner* — Jorge L Salazar, Jr.
(74) *Attorney, Agent, or Firm* — Amerson Law Firm, PLLC

(57) ABSTRACT

A product disclosed herein includes an RF filter die including an RF filter, a front side and a plurality of conductive bond pads conductively coupled to at least a portion of the RF filter, wherein at least a portion of the conductive bond pads is exposed on the front side of the RF filter die. The product also includes a TSV (Through-Substrate-Via) die that includes a plurality of conductive TSV contacts positioned on a back side of the TSV die and at least one conductive TSV (Through-Substrate-Via) structure that is conductively coupled to at least one of the plurality of conductive TSV contacts, wherein the back side of the TSV die is bonded to the front side of the RF filter such that the conductive bond pads on the RF filter die are conductively coupled to corresponding conductive TSV contacts positioned on the back side of the TSV die.

12 Claims, 18 Drawing Sheets

(51) Int. Cl.
  *H03H 9/10*    (2006.01)
  *H01L 23/00*   (2006.01)
  *H01L 41/313*  (2013.01)
  *H01L 21/768*  (2006.01)
  *H01L 21/78*   (2006.01)
  *H03H 9/54*    (2006.01)
  *H03H 9/64*    (2006.01)
  *H03H 9/13*    (2006.01)
  *H03H 9/145*   (2006.01)
  *H03H 3/02*    (2006.01)
  *H01L 23/48*   (2006.01)
  *H01L 41/332*  (2013.01)
  *H01L 41/29*   (2013.01)

(52) U.S. Cl.
  CPC ............ *H01L 23/481* (2013.01); *H01L 24/05* (2013.01); *H01L 24/08* (2013.01); *H01L 24/91* (2013.01); *H01L 24/94* (2013.01); *H01L 41/313* (2013.01); *H03H 3/02* (2013.01); *H03H 3/08* (2013.01); *H03H 9/13* (2013.01); *H03H 9/14538* (2013.01); *H03H 9/54* (2013.01); *H03H 9/64* (2013.01); *H01L 24/32* (2013.01); *H01L 24/80* (2013.01); *H01L 24/83* (2013.01); *H01L 41/29* (2013.01); *H01L 41/332* (2013.01); *H01L 2224/05009* (2013.01); *H01L 2224/0557* (2013.01); *H01L 2224/08145* (2013.01); *H01L 2224/32145* (2013.01); *H01L 2224/80031* (2013.01); *H01L 2224/80047* (2013.01); *H01L 2224/80895* (2013.01); *H01L 2224/83031* (2013.01); *H01L 2224/83047* (2013.01); *H01L 2224/83896* (2013.01); *H01L 2224/9211* (2013.01)

(58) Field of Classification Search
  CPC ... H01L 2224/05009; H01L 2224/0557; H01L 2224/9211; H03H 3/08; H03H 3/02; H03H 9/14538; H03H 9/13; H03H 9/64; H03H 9/54
  USPC .................... 333/133, 187, 188, 193–196
  See application file for complete search history.

(56) References Cited

U.S. PATENT DOCUMENTS

| | | | |
|---|---|---|---|
| 9,058,455 B2 | 6/2015 | Adkisson et al. | |
| 10,256,786 B1 * | 4/2019 | Gibb | .................... H03H 9/0514 |
| 2013/0187246 A1 | 7/2013 | Adkisson et al. | |
| 2017/0121172 A1 | 5/2017 | Xia et al. | |

* cited by examiner

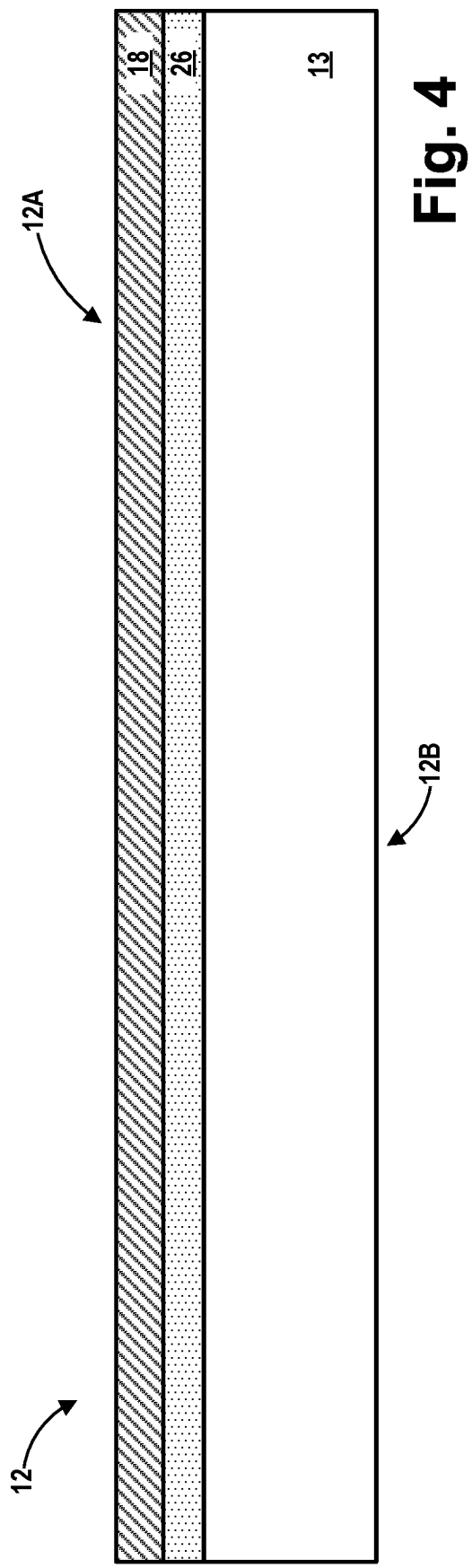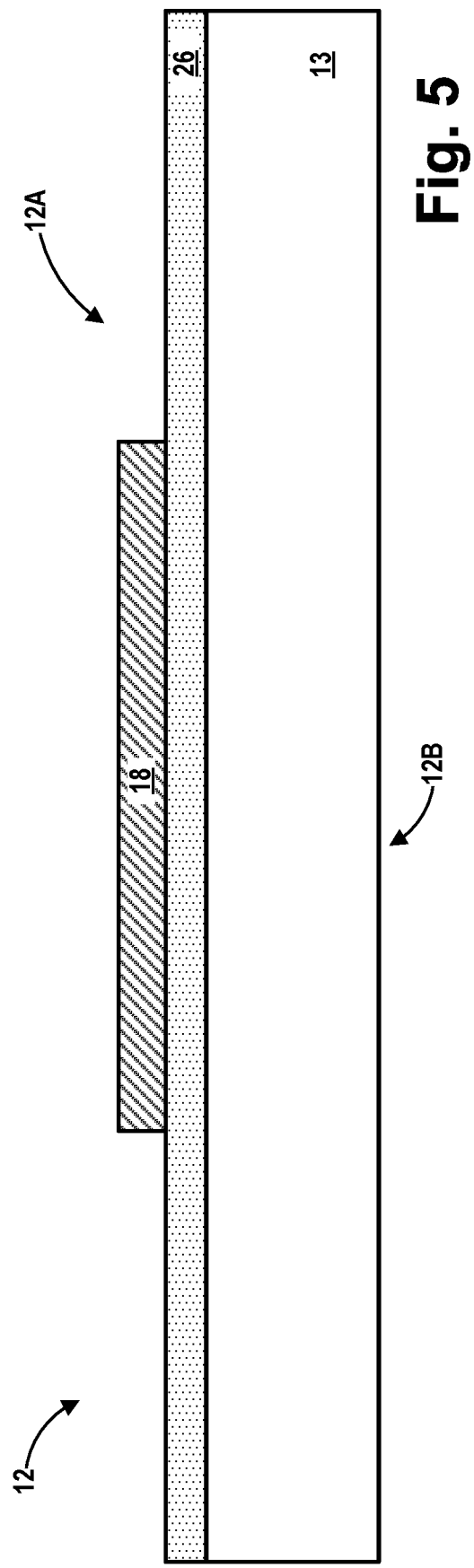

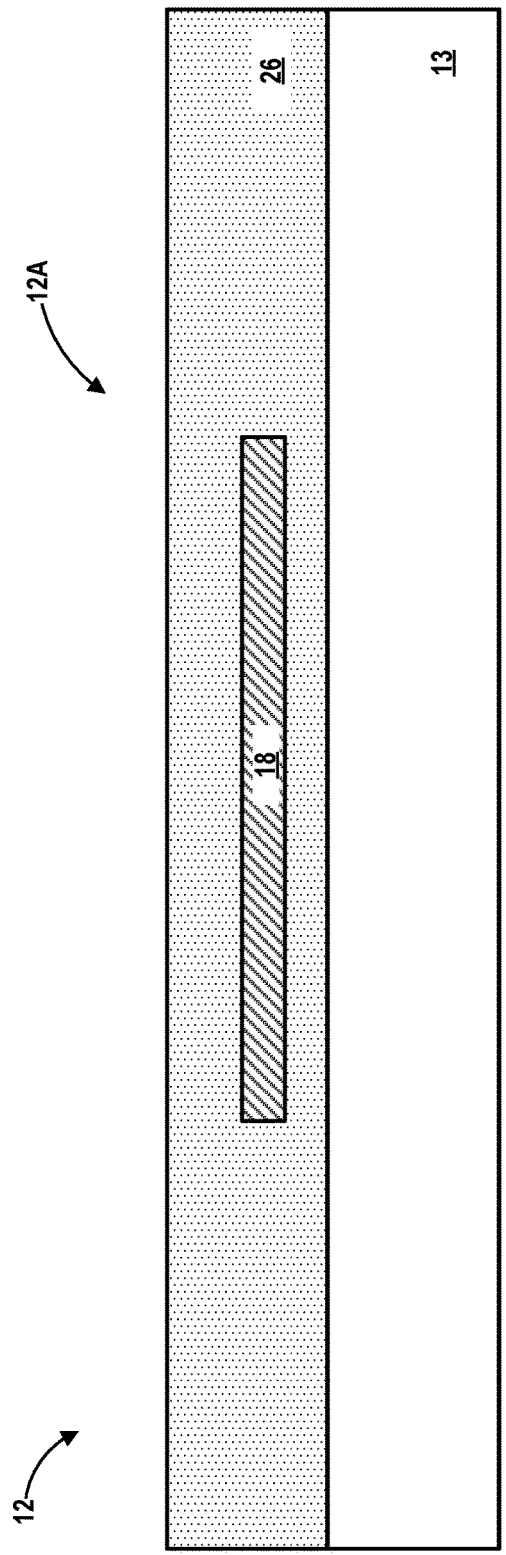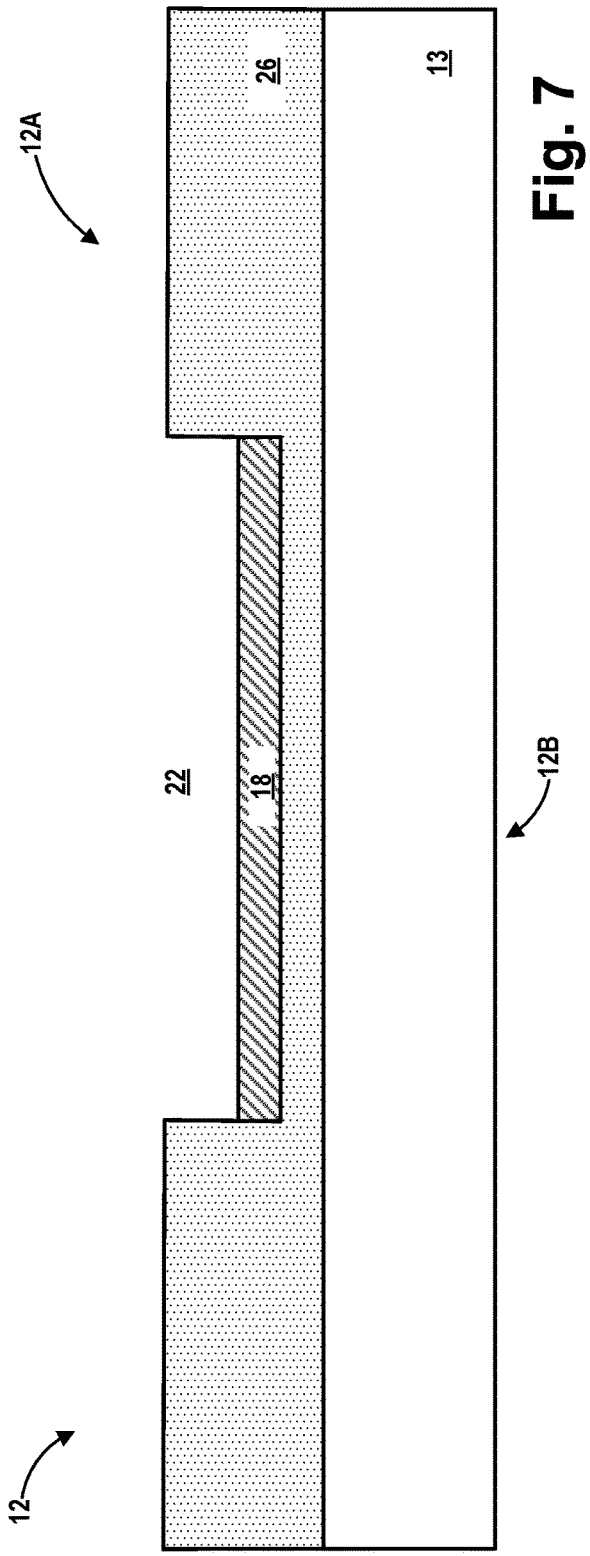

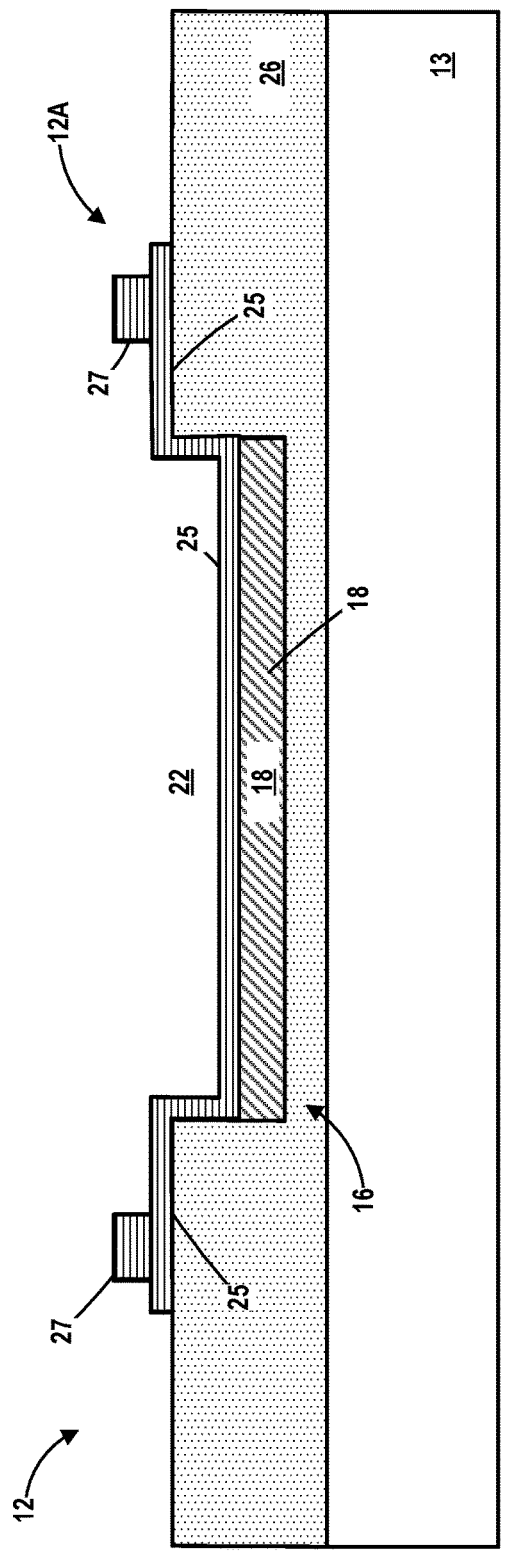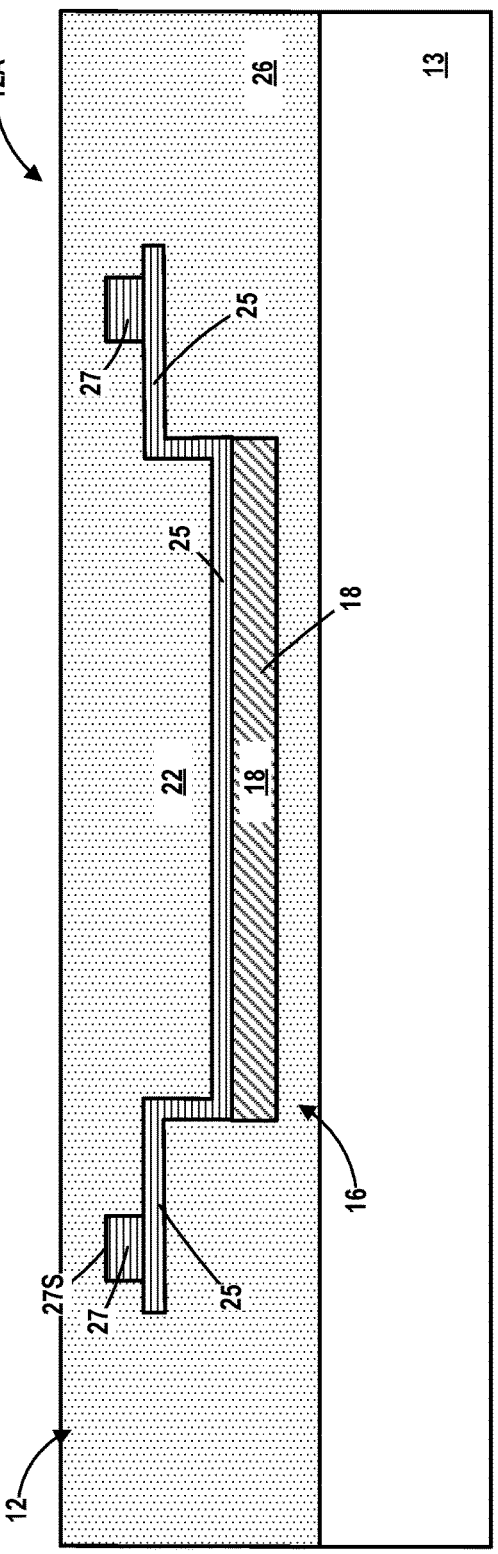

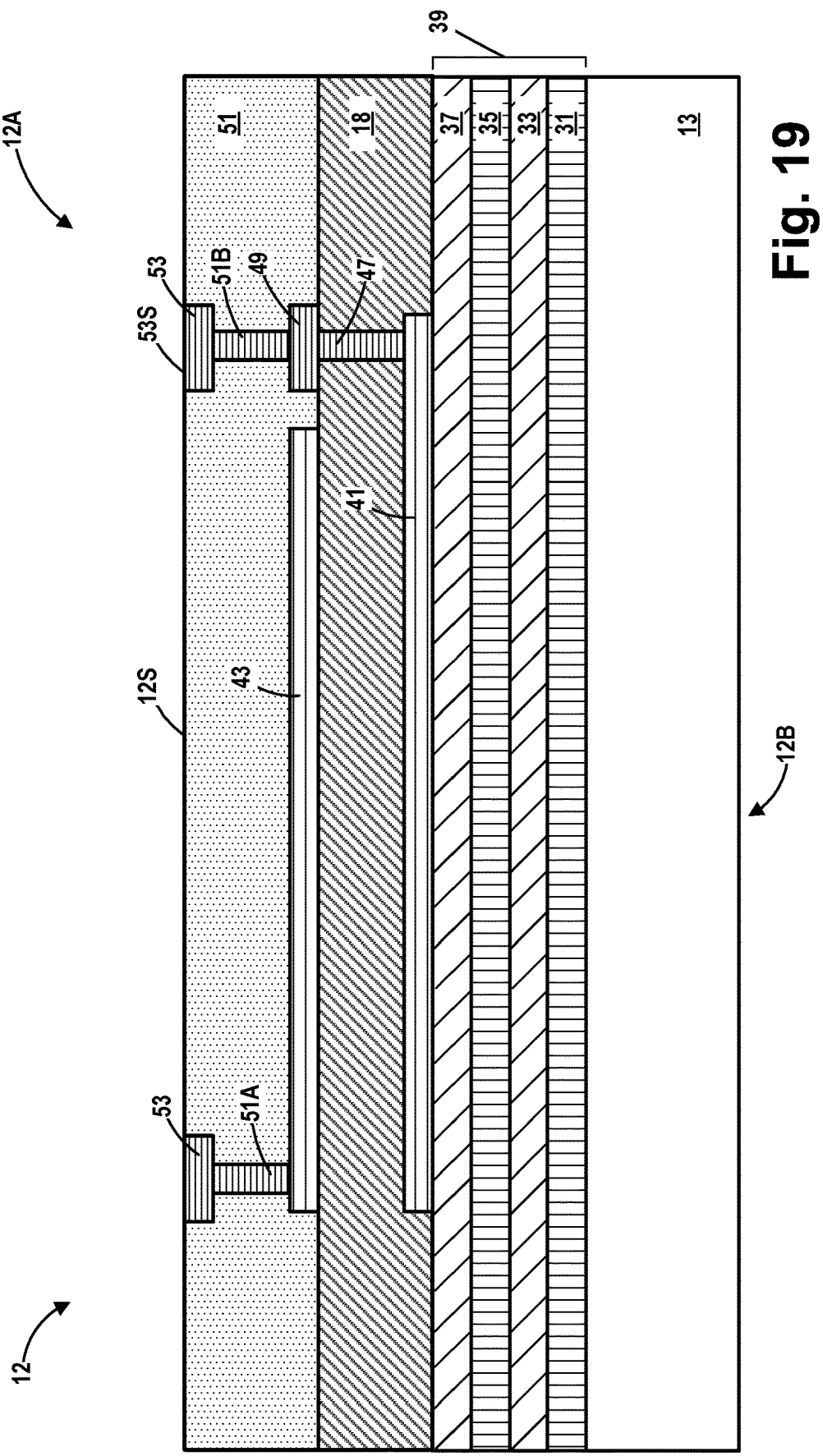

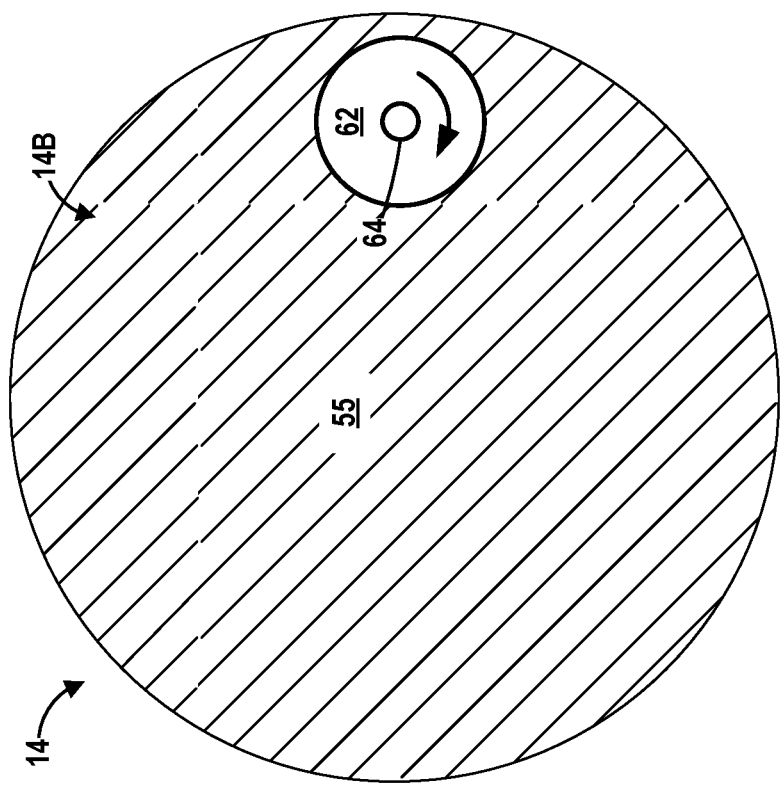
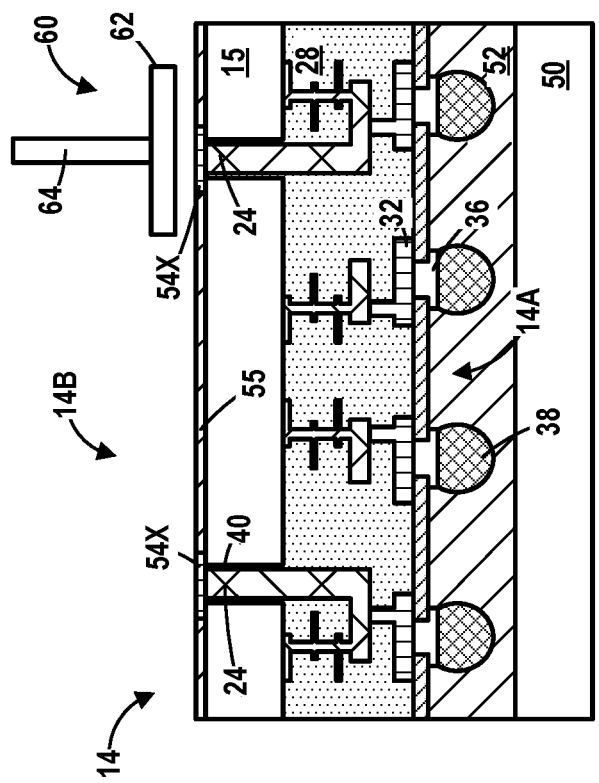
Fig. 21
Fig. 20

METHODS OF MANUFACTURING RF FILTERS

BACKGROUND OF THE INVENTION

1. Field of the Invention

The present disclosure generally relates to the fabrication of integrated circuits, and, more particularly, to various methods of manufacturing radio frequency (RF) filters and various RF filter structures.

2. Description of the Related Art

Radio frequency (RF) filters are used in wireless communication systems. Two types of RF filters are Surface Acoustic Wave (SAW) filters and Bulk Acoustic Wave (BAW) filters. A SAW filter typically comprises a pair of interdigitated electrical conductive traces (IDTs) formed on a surface of a piezoelectric material. A BAW filter typically comprises a piezoelectric material sandwiched between two electrodes and acoustically isolated from the surrounding medium. SAW filters are generally used at relatively lower frequencies, e.g., below 2.5 GHz, whereas BAW filters are generally used at relatively higher frequencies, e.g., above 2.5 GHz.

SAW and BAW filter devices are typically fabricated on a semiconductor die. The semiconductor die must ultimately be positioned in some form of package to be sold to the end user. Such packaging performs several functions including, but not limited to, protecting the semiconductor die from mechanical and environmental damage, and providing a means by which electricity can flow to and from the die. Semiconductor die have traditionally been electrically connected to a package by wire bonding techniques wherein wires are attached to pads of the die and to pads located in the cavity of the plastic or ceramic package. Wire bonding is still the interconnection strategy most often used in the semiconductor industry today. But the growing demand for products that are smaller, faster, less expensive, more reliable and have a reduced thermal profile has pushed wire bonding technology to its limits (and beyond), thereby creating barriers to sustained product improvement and growth.

There is a constant trend toward miniaturization of electronic products such as mobile phones, tablets, digital cameras and the like. Consequently, there has been a constant trend in semiconductor device manufacturing towards smaller and more densely packed semiconductor structures. This has resulted in a demand for semiconductor packages which are relatively lightweight structures and which support increased electronic capabilities (e.g., increased density, mobility and extended operational life) in miniaturized electronic products.

The present disclosure is directed to various methods of manufacturing radio frequency (RF) filters and various RF filter structures that may eliminate or at least reduce one or more of the problems identified above.

SUMMARY OF DISCLOSED EMBODIMENTS

The following presents a simplified summary of the disclosed embodiment in order to provide a basic understanding of some aspects of the subject matter disclosed herein. This summary is not an exhaustive overview of all of the subject matter disclosed herein. It is not intended to identify key or critical elements of the subject matter disclosed herein or to delineate the scope of any claims directed to any of the subject matter disclosed herein. Its sole purpose is to present some concepts in a simplified form as a prelude to the more detailed description that is discussed later in the application.

Generally, the present disclosure is directed to methods of manufacturing radio frequency (RF) filters and various RF filter structures. One illustrative product disclosed herein includes an RF filter die including an RF filter, a front side and a plurality of conductive bond pads that are conductively coupled to at least a portion of the RF filter, wherein at least a portion of each of the conductive bond pads is exposed on the front side of the RF filter die. The product also includes a TSV (Through-Substrate-Via) die that includes a plurality of conductive TSV contacts positioned on a back side of the TSV die and at least one conductive TSV (Through-Substrate-Via) structure that is conductively coupled to at least one of the plurality of conductive TSV contacts, wherein the back side of the TSV die is bonded to the front side of the RF filter die such that the conductive bond pads on the RF filter die are conductively coupled to corresponding conductive TSV contacts positioned on the back side of the TSV die.

Also disclosed herein is an RF filter die that includes a front side that includes insulating material with a substantially planar surface that forms a portion of the front side of the RF filter die and an RF filter. In this example, the product also includes a plurality of conductive bond pads that are conductively coupled to at least a portion of the RF filter, wherein the conductive bond pads have a substantially planar surface that is substantially planar with the substantially planar surface of the insulating material such that at least a portion of each of the conductive bond pads is exposed on the front side of the RF filter die.

One illustrative method disclosed herein includes forming an RF filter wafer that includes a plurality of RF filter die and a front side that includes insulating material with a substantially planar surface, the insulating material being positioned above each of the plurality of RF filter die, and forming a TSV (Through-Substrate-Via) wafer including a plurality of TSV (Through-Substrate-Via) die and a plurality of conductive TSV contacts positioned on the back side of the TSV die, each of the TSV die including at least one conductive TSV (Through-Substrate-Via) structure that is conductively coupled to at least one of the plurality of conductive TSV contacts. The method also includes bonding the front face of the RF filter wafer to the back side of the TSV wafer such that the conductive bond pads on the RF filter die are conductively coupled to corresponding conductive TSV contacts positioned on the back side of the TSV wafer.

BRIEF DESCRIPTION OF THE DRAWINGS

The disclosure may be understood by reference to the following description taken in conjunction with the accompanying drawings, in which like reference numerals identify like elements, and in which:

FIG. 4 depicts an example disclosed herein where the RF filter is a SAW filter after the formation of a layer of insulating material and a layer of piezoelectric material were formed above the front side of an RF filter wafer;

FIG. 5 depicts the RF filter wafer after the layer of piezoelectric material was patterned;

FIG. 6 depicts the RF filter wafer after additional insulating material was formed above the upper surface of the patterned layer of piezoelectric material shown in FIG. 5;

FIG. 7 depicts the RF filter wafer after an etching process was performed to form a filter cavity above the patterned layer of piezoelectric material;

FIG. 8 depicts the RF filter wafer after a layer of conductive material was formed on the front side of the RF filter wafer and after a plurality of conductive pads were formed that are conductively coupled to the layer of conductive material;

FIG. 9 depicts the RF filter wafer after additional insulating material was formed above the device shown in FIG. 8;

FIG. 19 depicts the RF filter wafer after a plurality of conductive vias were formed on the device shown in FIG. 18;

FIG. 20 is a reduced-size version an illustrative embodiment of a TSV wafer disclosed herein after it has been completely fabricated;

FIG. 21 is a plan view showing the back side of the TSV wafer shown in FIG. 20;

Figure 1:
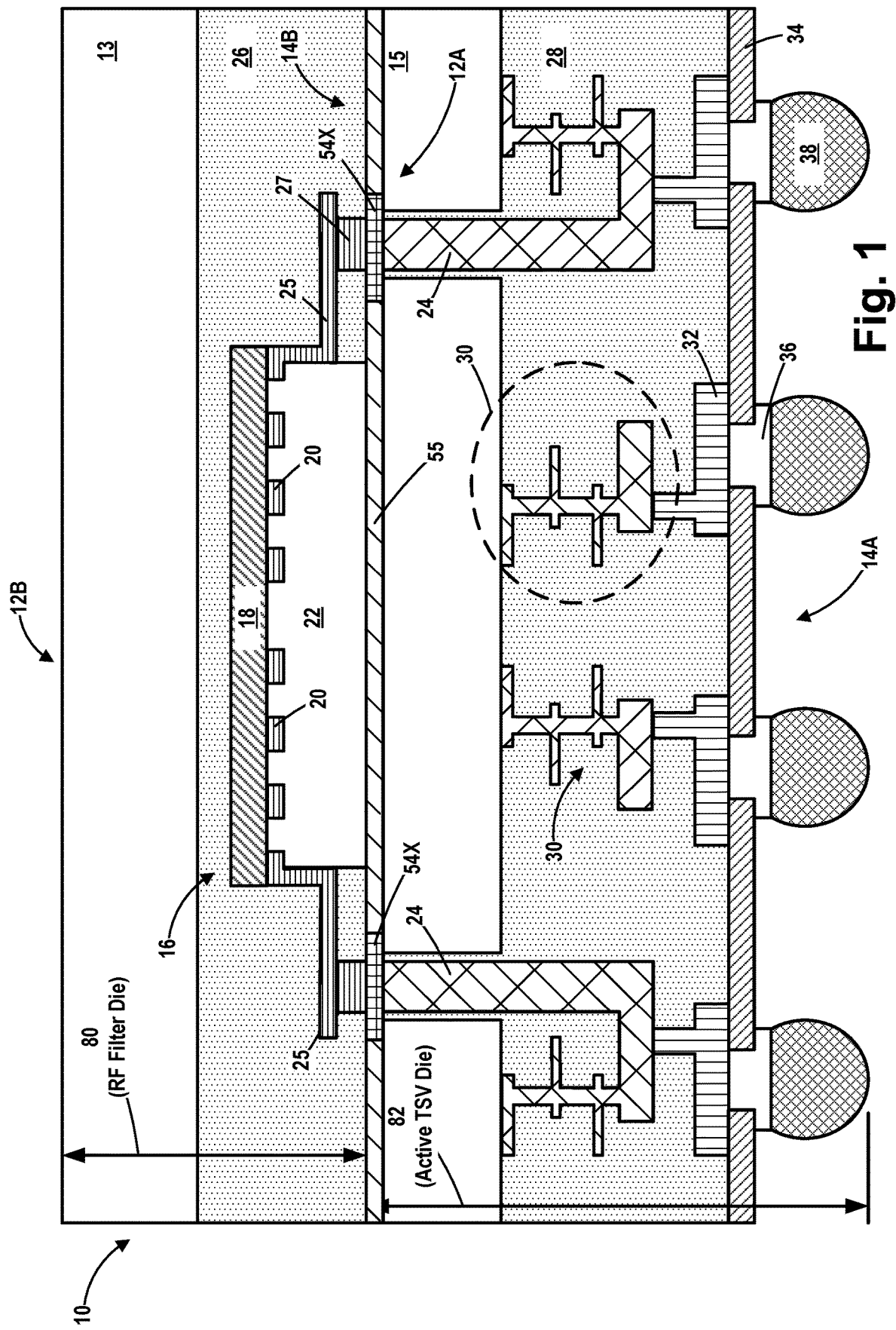
FIG. 1 depicts one illustrative embodiment of an integrated circuit (IC) product disclosed herein that includes an illustrative RF filter die that is bonded to an active TSV (Through-Substrate-Via) die.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of manufacturing radio frequency (RF) filters and various RF filter structures. As will be readily apparent to those skilled in the art upon a complete reading of the present application, the presently disclosed methods may be employed when forming SAW and/or BAW filter devices. However, the presently disclosed inventions should not be considered to be limited to any particular type or form of RF filter device. With reference to the attached figures, various illustrative embodiments of the methods and devices disclosed herein will now be described in more detail.

FIG. 1 depicts one illustrative embodiment of an integrated circuit (IC) product 10 that includes an illustrative RF filter die 80 that is bonded to an active TSV (Through-Substrate-Via) die 82 using the methods disclosed herein. The RF filter die 80 comprises an RF filter 16. In the example shown in FIG. 1, the illustrative RF filter 16 is a SAW filter. However, as will be appreciated by those skilled in the art after a complete reading of the present application, a BAW filter could be substituted for the illustrative SAW filter shown in FIG. 1.

In general, a plurality of the RF filter die 80 (each comprising an RF filter 16) will be fabricated on an RF filter wafer (or substrate) 12. Similarly, a plurality of the TSV die 82 will be fabricated on a separate active TSV (Through-Substrate-Via) wafer (or substrate) 14. The RF filter wafer 12 has a front side 12A and a back side 12B. Similarly, the active TSV wafer 14 has a front side 14A and a back side 14B. The active TSV wafer 14 will be processed to completion separately of the processing of the RF filter wafer 12. As described more fully below, after both the RF filter wafer 12 and the active TSV wafer 14 have been completely manufactured, the front side 12A of the RF filter wafer 12 will be bonded to the back side 14B of the active TSV wafer 14 using a known wafer-to-wafer hybrid bonding processes. At that point, the combination of the bonded RF filter wafer 12 and active TSV wafer 14 will be diced (or singulated) using traditional dicing equipment to cut through both the RF filter wafer 12 and the active TSV wafer 14 to produce a plurality of the illustrative IC products 10 shown in FIG. 1 comprised of the RF filter die 80 and the active TSV die 82. Additional packaging materials (not shown) may then be positioned around each of the IC products 10 and sold. It should be noted that the claims presented below with respect to the IC product 10 will be drafted in the context of the RF filter die 80 being positioned vertically above the active TSV die 82.

One illustrative embodiment of the RF filter die 80 portion of the IC product 10 comprises a substrate 13 and an illustrative RF filter 16. As noted above, in the example depicted in FIG. 1, the RF filter 16 is a SAW filter. Thus, the RF filter 16 comprises a layer of piezoelectric material 18 and a plurality of simplistically depicted interdigitated electrical conductive traces (IDTs) 20 that are conductively coupled to a plurality of conductive lines 25 that terminate in conductive pads 27. Also depicted in FIG. 1 are one or more layers of insulating material 26, e.g., silicon dioxide, silicon nitride, etc. As will be described more fully below, the RF filter wafer 12 is manufactured such that, after completion of the manufacturing of the RF filter wafer 12, there are a plurality of RF filter die 80 (each comprising an RF filter 16) formed on the RF filter wafer 12. Each of the RF filter die 80 comprises an RF filter 16, a plurality of conductive pads 27 that are conductively coupled to the RF filter 16 by other conductive structures (e.g., conductive lines) and an open filter cavity 22 located above at least a portion of the RF filter 16. The filter cavity 22 in each of the RF filter die 80 remains open until such time as the RF filter wafer 12 is bonded to the TSV wafer 14. The surfaces of the conductive pads 27 are substantially co-planar with the front side 12A of the RF filter wafer 12, and thus the surfaces of the conductive pads 27 are exposed such that they are conductively coupled to a conductive layer of material (described below) formed on the back side 14B of the TSV wafer 14.

One illustrative embodiment of the active TSV die 82 portion of the IC product 10 comprises a substrate 15 and one or more layers of insulating material 28, e.g., silicon dioxide, silicon nitride, etc. A plurality of conductive members 30 are formed above the substrate 15. The conductive members 30 are illustrative in nature and they may be coupled to one or more active and/or passive devices (not shown), e.g., transistors, resistors, capacitors, etc., formed on the front side 14A of the TSV wafer 14. TSVs (Through-Substrate-Vias) are formed in the TSV wafer 14 by performing the methods described more fully below. In the depicted example, each of the illustrative active TSV die 82 comprises a plurality of conductive pads 32, e.g., aluminum pads, a passivation layer 34 (e.g., a poly amide layer), a conductive under-bump metallization pad 36 (e.g., copper) and a plurality of solder balls 38 (e.g., tin (Sn), gold (Au), etc.). Each of the illustrative active TSV die 82 also comprises a plurality of conductive TSV structures 24 that extend through the back side 14B of the TSV substrate 14. The TSV die 82 also includes a plurality of conductive TSV contacts 54X positioned on the back side 14B of the TSV wafer 14. In one embodiment, each of the conductive TSV contacts 54X is adapted to contact a corresponding individual conductive TSV structure 24. Also depicted in FIG. 1 is an insulating material 55 (e.g., silicon dioxide) that was formed between the conductive TSV contacts 54X. After the RF filter wafer 12 and the TSV wafer 14 are bonded to one another, the conductive pads 27 on the RF filter wafer 12 are conductively coupled to the conductive TSV contacts 54X and TSV structures 24 on the TSV wafer 14.

The substrates 13, 15 may be comprised of a variety of different materials, e.g., a semiconductor material, glass, etc., and the substrates 13, 15 need not be comprised of the same material, although that may be the case in some applications. The substrates 13, 15 may have a variety of configurations, such as the bulk substrate configuration depicted herein. Thus, the terms "substrate" or "semiconductor substrate" should be understood to cover all of any of a variety of different materials, including but not limited to, semiconductor materials, insulating materials, etc. The various components and structures of the devices disclosed herein may be formed using a variety of different materials and by performing a variety of known techniques, e.g., a chemical vapor deposition (CVD) process, an atomic layer deposition (ALD) process, a thermal growth process, spin-coating techniques, epi growth processes, etc. The thicknesses of these various layers of material may also vary depending upon the particular application.

Figure 2:
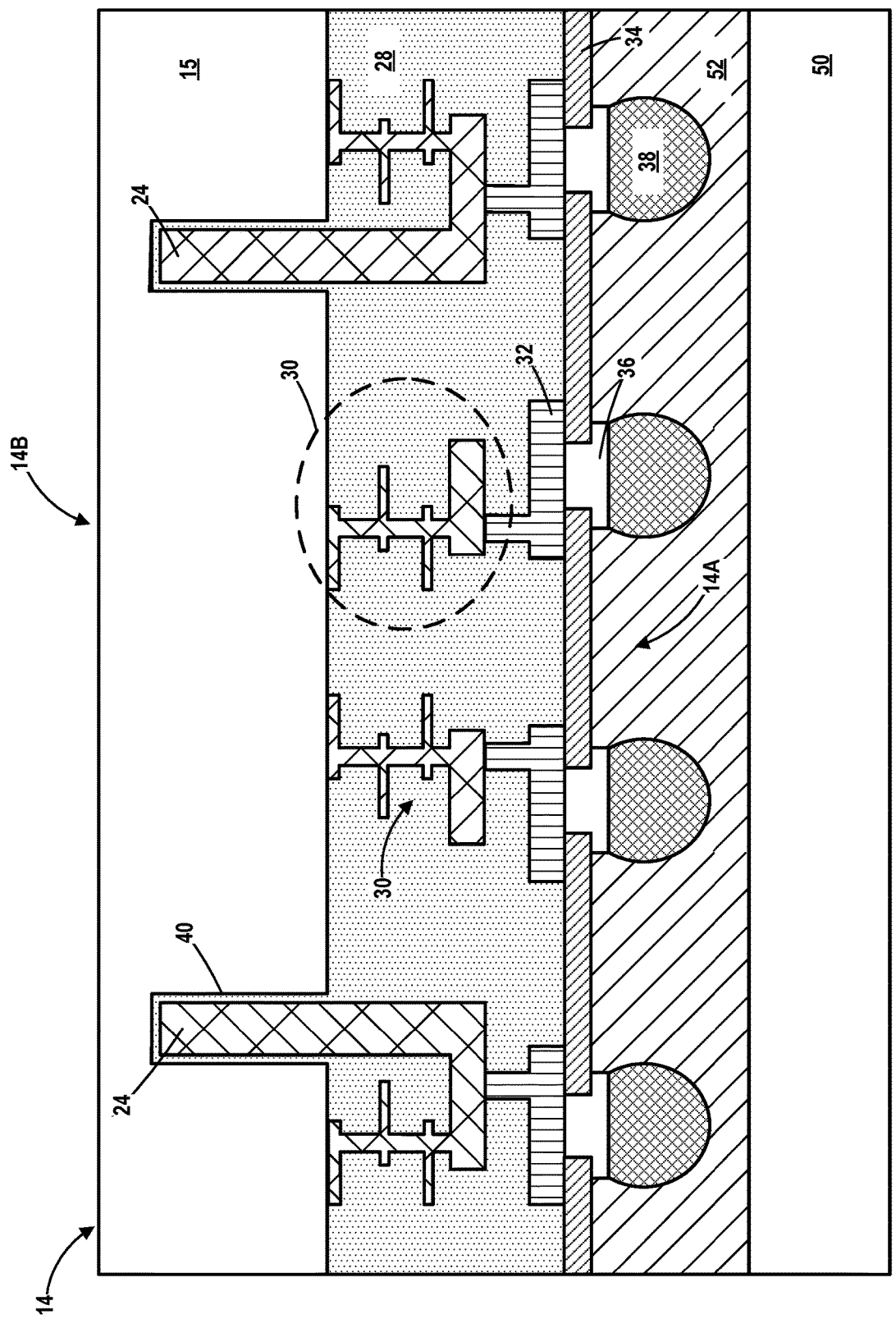
FIGS. 2-3 depict one illustrative technique for forming one illustrative embodiment of the TSV substrate disclosed herein.
Figure 3:
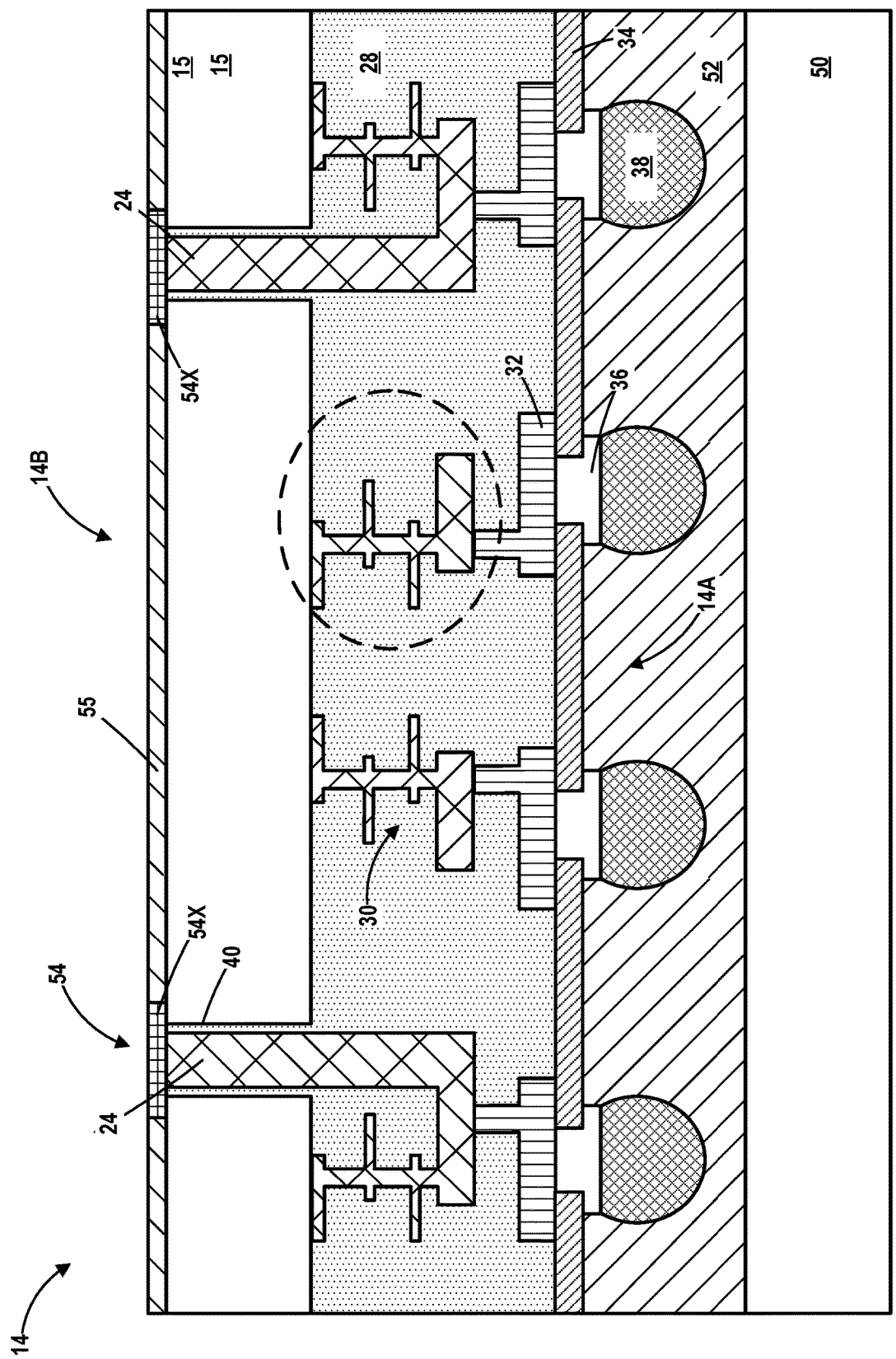

FIGS. 2-3 depict one illustrative technique for forming one illustrative embodiment of the TSV substrate 14 depicted in FIG. 1. All of the structures depicted in FIG. 2 may be formed by performing traditional manufacturing techniques. FIG. 2 depicts the TSV substrate 14 after the TSV structures 24 were initially formed in the substrate 15 using traditional manufacturing techniques. At this point in the process flow, a plurality of recesses 40 were formed in the substrate 15, openings (not shown) that were aligned with the recesses 40 were formed in the insulating material 28 and a conformal liner layer of insulating material (not separately shown) was formed in the recesses 40. Thereafter, the conductive material for the conductive TSV structures 24 was formed in the now-lined recesses 40. As depicted, at this point in the process flow, the depth of the recesses 40 is such that the recesses do not extend all of the way to the back side 14B of the TSV substrate 14. Also depicted in FIG. 2 is a layer of organic glue material 52 and a so-called handle wafer (or substrate) 50 that is attached to the front side 14A of the TSV wafer 14 so as to facilitate further processing of the TSV substrate 14. The wafer 50 may be comprised of one or more of the materials identified above for the substrates 13, 15. The thickness of the layer of organic glue material 52 and the substrate 50 may vary depending upon the particular application. The TSV structures 24 may be comprised of a variety of different materials, e.g., copper, tungsten, etc.

FIG. 3 depicts the TSV substrate 14 after several process operations were performed. First, one or more CMP (Chemical Mechanical Polishing) processes and/or etch back process operations were performed to remove portions of the substrate 15 so as to expose the TSV structures 24. Thereafter, a layer of insulating material 55, e.g., silicon dioxide, with a plurality of conductive TSV contacts 54X formed therein, was formed across the entire back side 14B of the TSV substrate 14. As depicted, the conductive TSV contacts 54X are conductively coupled to corresponding TSV structures 24. In one illustrative process flow, the insulating material 55 was blanket-deposited across the entire back side 14B and thereafter patterned to define openings for the conductive TSV contacts 54X. At that point, conductive material for the conductive TSV contacts 54X was deposited so as to overfill the openings in the layer of insulating material. Thereafter, a CMP process was performed to remove excess amounts of the conductive material, thereby leaving the conductive TSV contacts 54X positioned in the openings in the layer of insulating material 55. In another illustrative process flow, a layer of conductive material may be blanket-deposited across the entire back side 14B and thereafter patterned to define the conductive TSV contacts 54X. At that point, the insulating material 55 may be formed between the conductive TSV contacts 54X and a CMP process may be performed to remove excess portions of the insulating material 55 positioned above the conductive TSV contacts 54X. The thickness of the patterned layer of conductive TSV contacts 54X and their composition may vary depending upon the particular application. For example, the conductive TSV contacts 54X may have a thickness of about 2.5-4.5 µm, and they may be comprised of a variety of different conductive materials, e.g., copper. At this point in the process flow, the manufacturing of the TSV wafer 14 (comprised of a plurality of active TSV die 82) is substantially complete and it is ready to be bonded to the RF filter wafer 12 using the methods described more fully below.

FIGS. 4-12 depict one illustrative process flow for forming the RF filter wafer 12 wherein the RF filter 16 is a simplistically depicted SAW filter. Only the formation of a single RF filter die 80 will be depicted. FIG. 4 depicts the RF filter wafer 12 after several process operations were performed. First, a layer of insulating material 26 was blanket-deposited across the entire front side 12A of the RF filter wafer 12. Thereafter, a layer of piezoelectric material 18 was blanket-deposited above the layer of insulating material 26. The composition and thickness of the layers 26 and 18 may vary depending upon the particular application. In one illustrative embodiment, the layer of insulating material 26 may be formed to a thickness of about 500-600 µm, and it may be comprised of an insulating material such as, for example, silicon dioxide, silicon nitride, etc. In one illustrative embodiment, the layer of piezoelectric material 18 may be formed to a thickness of about 200-300 µm, and may be comprised of a variety of different piezoelectric materials suitable for use in an RF filter 16, such as, for example, zinc oxide (ZnO), zinc sulfide (ZnS), aluminum nitride (AlN), lithium tantalate ($LiTaO_3$), other members of the lead lanthanum-zirconate-titanate family, quartz, gallium orthophosphate ($GaPO_4$), langasite/langatate/langanite crystals, etc.

FIG. 5 depicts the RF filter wafer 12 after an etching process was performed through a patterned etch mask (not shown), e.g., a patterned layer of photoresist material, to pattern the layer of piezoelectric material 18. The size of the patterned layer of piezoelectric material 18 may vary depending upon the particular application. In one illustrative embodiment, when viewed from above, the patterned layer of piezoelectric material 18 may have a generally rectangular or generally square configuration. After the etching process was completed, the patterned etch mask was removed. Of course, there will be several of these patterned layers of piezoelectric material 18 formed across the RF filter wafer 12 (i.e., one for each of the RF filter die 80).

FIG. 6 depicts the RF filter wafer 12 after several process operations were performed. First, additional insulating material 26, such as silicon dioxide, was deposited on the RF filter wafer 12 such that the additional insulating material 26 is formed above the upper surface of the patterned layer of piezoelectric material 18. Thereafter, a chemical mechanical polishing (CMP) process was performed to planarize the upper surface of the additional insulating material 26. It should be noted that this additional insulating material may actually be in the form of another separate layer of material. However, such separate layers of the insulating material 26 are not shown in the drawings. Additionally, the additional insulating material formed at this point in the process (as well as in other points in the process flow described below) may or may not be the same material as that of the under-lying insulating material previously formed on the product 10. No attempt will be made to show the insulating material as separate layers of material.

FIG. 7 depicts the RF filter wafer 12 after an etching process was performed through a patterned etch mask (not shown), e.g., a patterned layer of photoresist material, to remove portions of the insulating material 26 positioned above the layer of piezoelectric material 18. This process operation results in the formation of an open filter cavity 22 above the now-exposed layer of piezoelectric material 18. After the etching process was completed, the patterned etch mask was removed.

FIG. 8 depicts the RF filter wafer 12 after several process operations were performed. First, a conformal layer of conductive material 25 was formed across the entire front side 12A of the RF filter wafer 12. As depicted, the conformal layer of conductive material 25 is positioned above the upper surface of the insulating material 26 and on the sidewalls and bottom surface of the open filter cavity 22. Thereafter, an etching process was performed through a patterned etch mask (not shown), e.g., a patterned layer of photoresist material, to pattern the conformal layer of conductive material 25. At that point, the patterned etch mask was removed and another patterned contact masking layer (not shown) was formed above the now-patterned conformal layer of conductive material 25. This patterned etch mask has openings corresponding to locations where a plurality of conductive pads 27 will be formed that are conductively coupled to the conformal layer of conductive material 25. Thereafter, one or more process operations may be performed to form the conductive pads 27. For example, additional conductive material may be deposited on the RF filter wafer 12 so as to over-fill the openings in the patterned contact masking layer. At that point, a CMP process may be performed to remove excess amounts of the conductive material positioned above the upper surface of the patterned contact masking layer so as to effectively form the conductive pads 27. At that point, the patterned contact masking layer may be removed. The conductive pads 27 may be comprised of a variety of different materials, e.g., copper, tungsten, and the conductive pads 27 may be comprised of the same material or a different material than that used for the conformal layer of conductive material 25.

FIG. 9 depicts the RF filter wafer 12 after additional insulating material 26, such as silicon dioxide, was deposited on the RF filter wafer 12. This additional insulating material covers the conformal layer of conductive material 25 and the surface 27S of the conductive pads 27.

Figure 10:
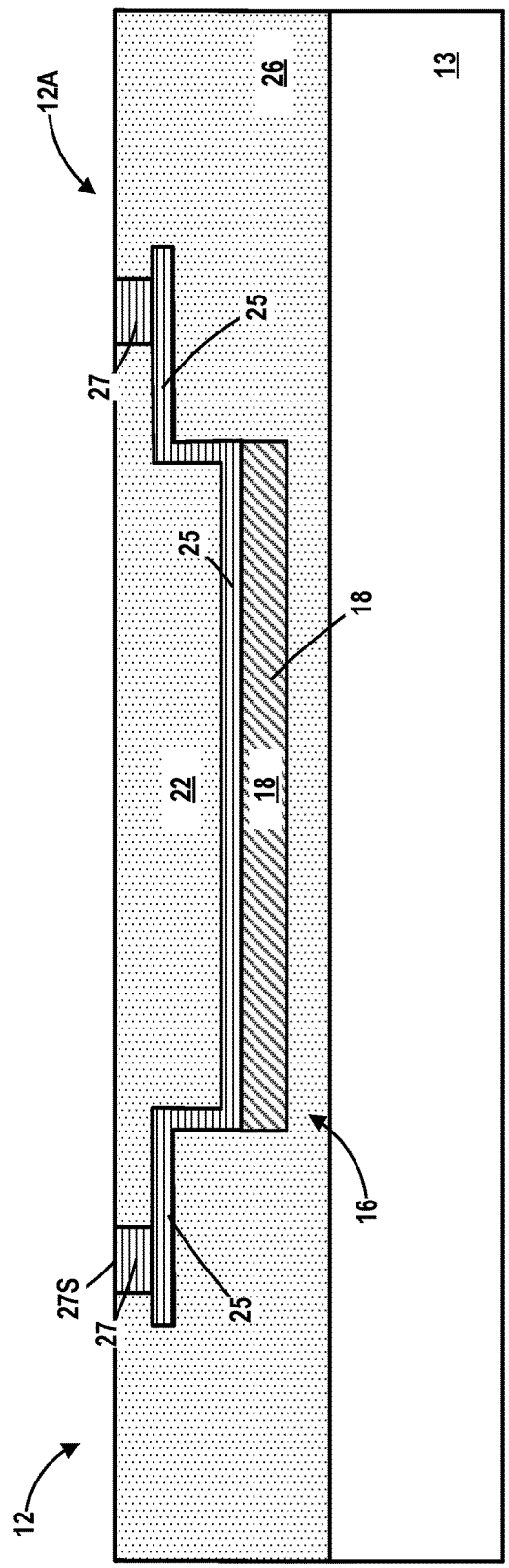
FIG. 10 depicts the RF filter wafer after a chemical mechanical polishing (CMP) and/or etch back process was performed to remove portions of the insulating material positioned above the conductive pads and thereby expose the conductive pads.

FIG. 10 depicts the RF filter wafer 12 after another chemical mechanical polishing (CMP) and/or etch back process was performed to remove portions of the insulating material 26 positioned above the conductive pads 27. At the conclusion of this process operation, the upper surfaces 27S of the conductive pads 27 are exposed, and the surfaces 27S are substantially co-planar with the front side 12A of the RF filter wafer 12.

Figure 11:
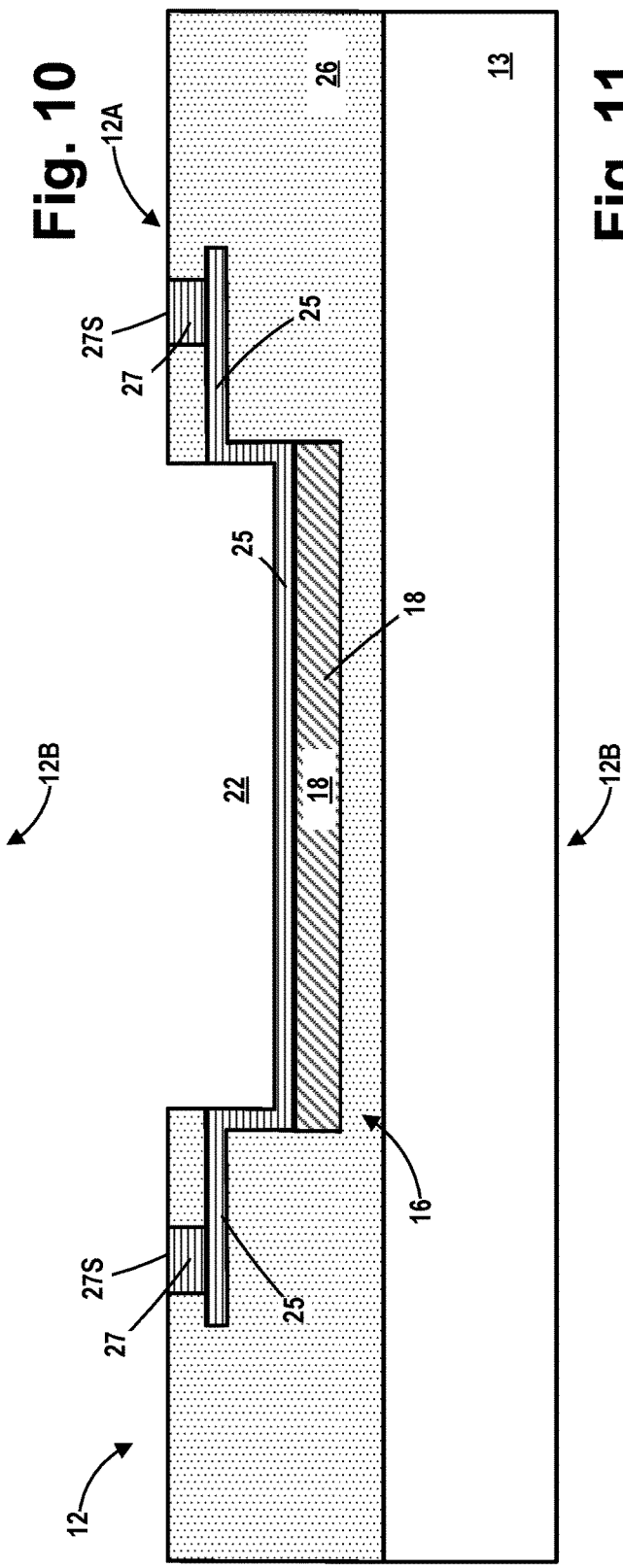
FIG. 11 depicts the RF filter wafer after the insulating material within the filter cavity was removed.

FIG. 11 depicts the RF filter wafer 12 after several process operations were performed. First, a patterned etch mask (not shown), e.g., a patterned layer of photoresist material, was formed above the structure shown in FIG. 10. Thereafter, an etching process was performed through this patterned etch mask to remove portions of the insulating material 26 positioned within the filter cavity 22 and above substantially all of the portion of the conformal layer of conductive material 25 positioned in the bottom of the filter cavity 22.

Figure 12:
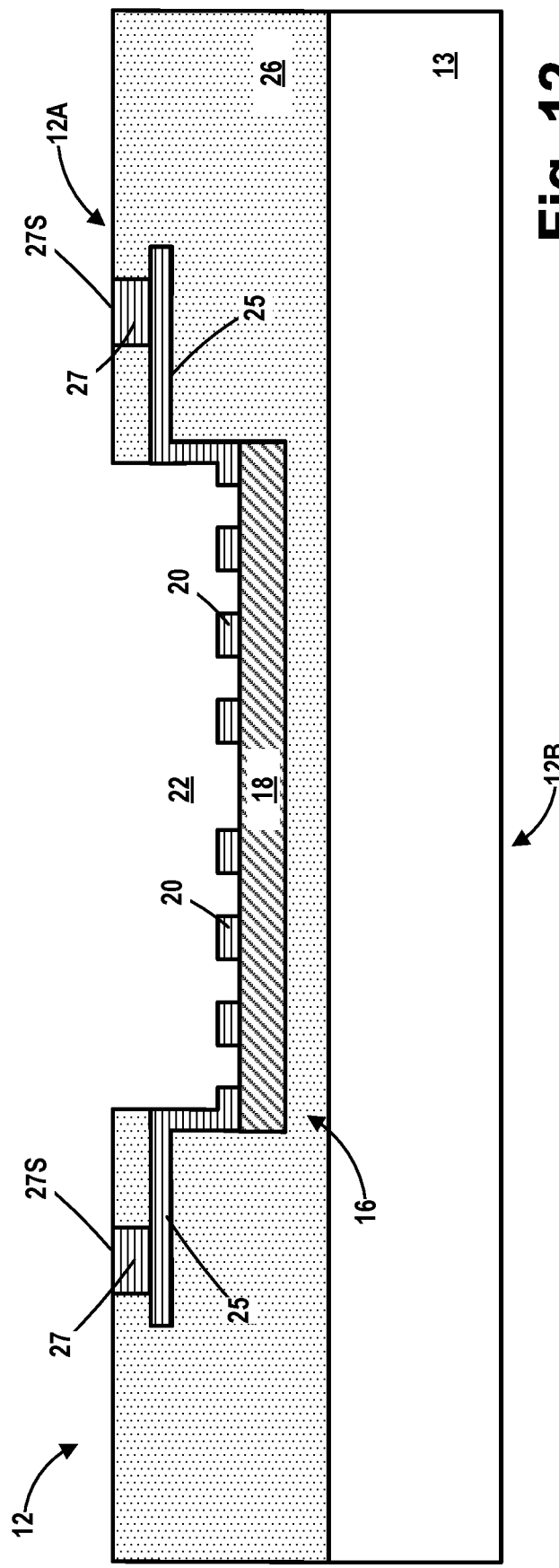
FIG. 12 depicts the RF filter wafer after the layer of conductive material was patterned to form a plurality of interdigitated electrical conductive traces (IDTs) for the RF filter.

FIG. 12 depicts the RF filter wafer 12 after several process operations were performed. First, a patterned etch mask (not shown), e.g., a patterned layer of photoresist material, was formed above the structure shown in FIG. 11. Thereafter, an etching process was performed through this patterned etch mask to remove exposed portions of the conformal layer of conductive material 25 positioned in the bottom of the filter cavity 22. This process operation results in the formation of a plurality of simplistically depicted IDTs 20 in the bottom of the filter cavity 22 above the layer of piezoelectric material 18. The size, number and configuration of the IDTs 20 may vary depending upon the particular application. After the etching process was completed, the patterned etch mask was removed. At this point in the process flow, the manufacturing of the RF filter wafer 12 is substantially complete and it is ready to be bonded to the TSV wafer 14, as described more fully below.

Figure 13:
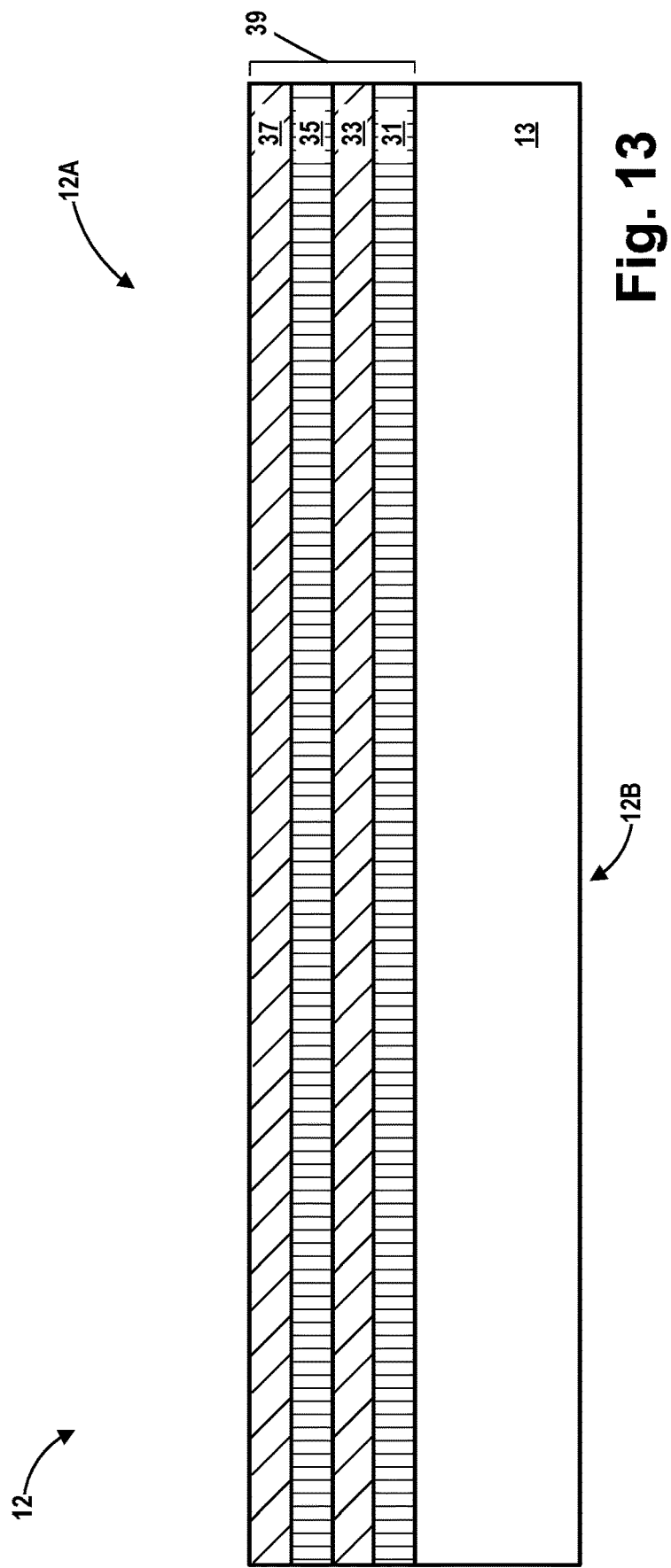
FIG. 13 depicts an example disclosed herein where the RF filter is a BAW filter after the formation of several layers of material that will constitute the acoustic mirror for the BAW filter.

FIGS. 13-19 depict one illustrative process flow for forming the RF filter wafer 12 wherein the RF filter 16 in each of the RF filter die 80 is a simplistically depicted BAW filter. Only the formation of a single RF filter die 80 will be depicted. FIG. 13 depicts the RF filter wafer 12 after several process operations are performed to form a plurality of layers of material above the substrate 13 that will collectively constitute an acoustic mirror 39 for the BAW filter. The number and composition of the layers of material that are formed for the acoustic mirror 39 may vary depending upon the particular application. In the depicted example, the acoustic mirror 39 comprises four layers of material 31, 33, 35 and 37 that were sequentially deposited above the substrate 13. The thickness and materials of construction of the layers may vary depending upon the particular application. For example, the first and third layers 31, 35 may comprise silicon dioxide, while the second and fourth layers 33, 37 may comprise silicon nitride. In the depicted example, all of the layers 31, 33, 35 and 37 have approximately the same thickness, but such a situation may not be present in all applications.

Figure 14:
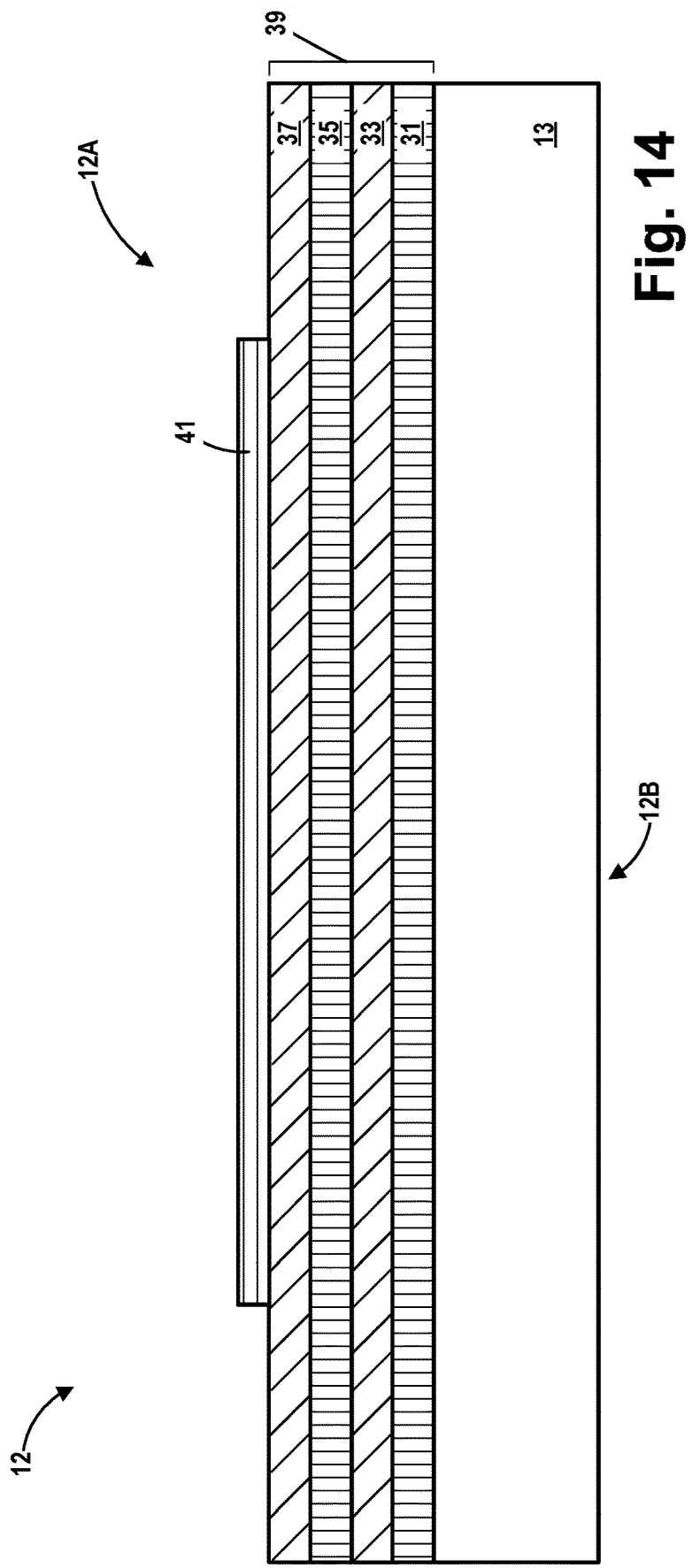
FIG. 14 depicts the RF filter wafer after the formation of a bottom electrode for the RF filter.

FIG. 14 depicts the product 10 after several process operations were performed to form a bottom electrode 41 for the RF filter 16. This was accomplished by blanket-depositing a layer of conductive material across the entire front side 12A of the RF filter wafer 12 and above the acoustic mirror layers 39. The composition and thickness of the bottom electrode 41 may vary depending upon the particular application. In one illustrative embodiment, the bottom electrode 41 may have a thickness of about 50-200 nm, and it may be comprised of a conductive material such as, for example, copper, aluminum, etc. Thereafter, an etching process was performed through a patterned etch mask (not shown), e.g., a patterned layer of photoresist material, to pattern the layer of conductive material and thereby form the bottom electrode 41. The size of the bottom electrode 41 may vary depending upon the particular application. In one illustrative embodiment, when viewed from above, the bottom electrode 41 may have a generally rectangular or generally square configuration. After the etching process was completed, the patterned etch mask was removed. Of course, there will be several of these patterned bottom electrodes 41 formed across the RF filter wafer 12 (i.e., one for each of the RF filter die 80).

Figure 15:
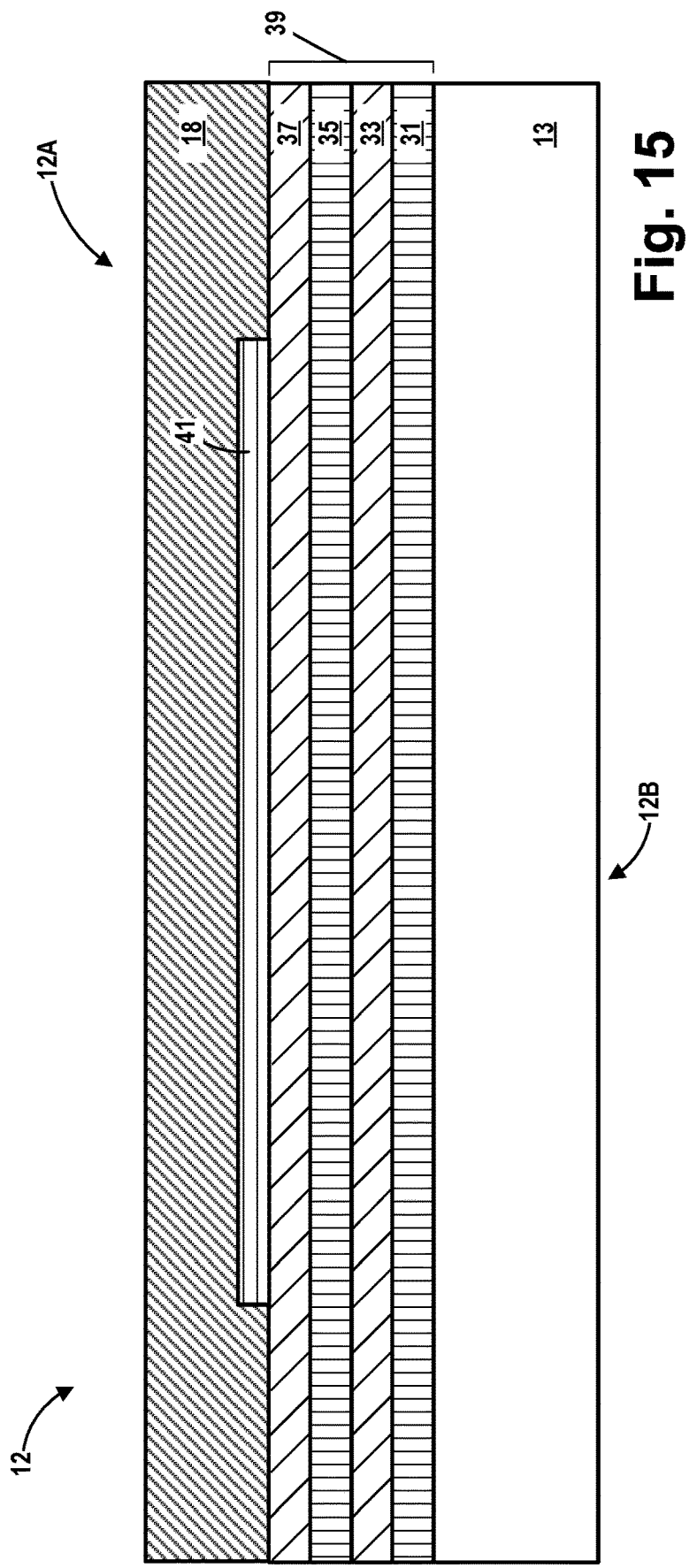
FIG. 15 depicts the RF filter wafer after a layer of piezoelectric material was formed above the bottom electrode and the acoustic mirror.

FIG. 15 depicts the RF filter wafer 12 after a layer of the above-described piezoelectric material 18 was formed above the bottom electrode 41 and the acoustic mirror 39. The thickness of the layer of piezoelectric material 18 may vary depending upon the particular application. Note that the thickness of the layer of piezoelectric material 18 is such that the layer of piezoelectric material 18 covers the bottom electrode 41.

Figure 16:
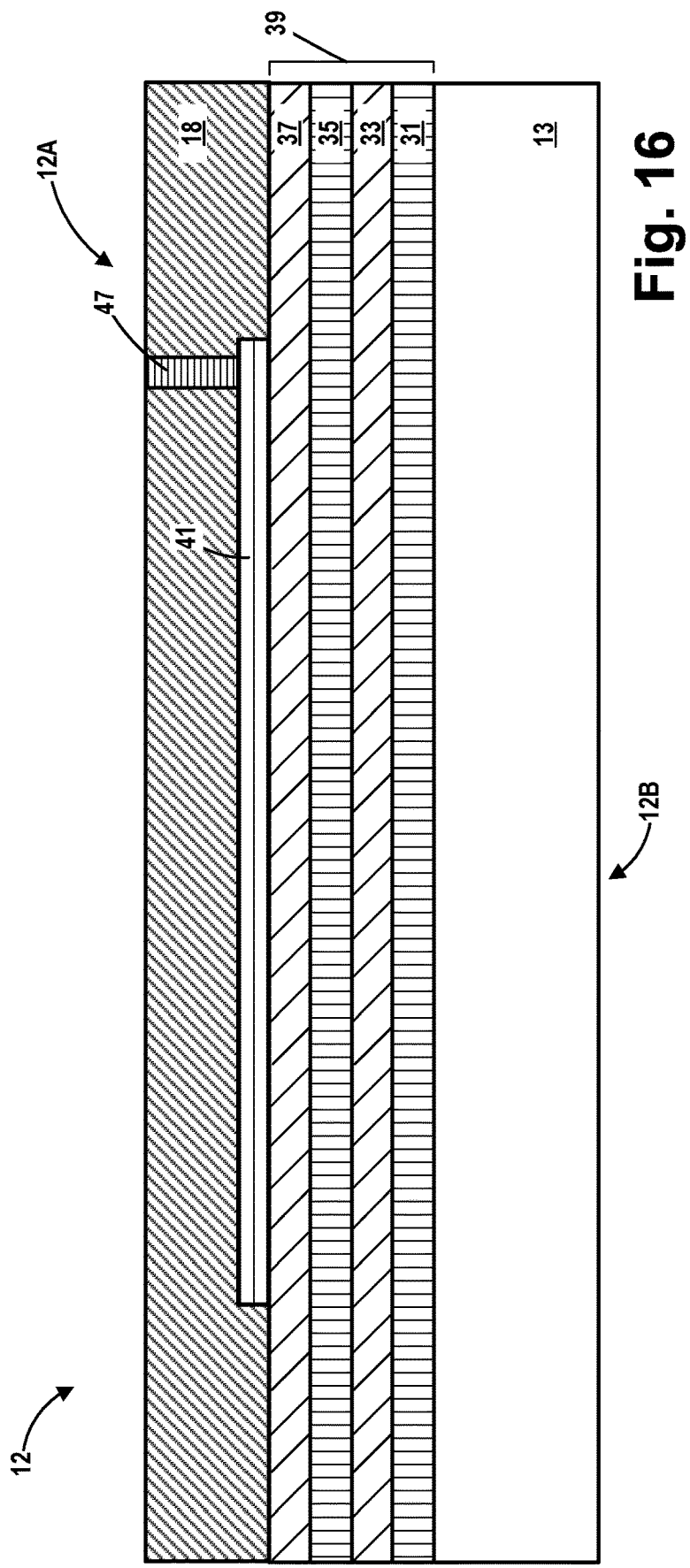
FIG. 16 depicts the RF filter wafer after a conductive via was formed in the layer of the piezoelectric material so as to conductively contact the bottom electrode.

FIG. 16 depicts the RF filter wafer 12 after several process operations were performed to form a simplistically depicted conductive via 47 in the layer of piezoelectric material 18 so as to establish an electrical contact path to the bottom electrode 41. The conductive via 47 may be formed by performing traditional manufacturing techniques, e.g., etching to form a via opening, filling the via opening with conductive material and performing a CMP process to remove excess amounts of the conductive material. As depicted, the conductive via 47 conductively contacts the bottom electrode 41.

Figure 17:
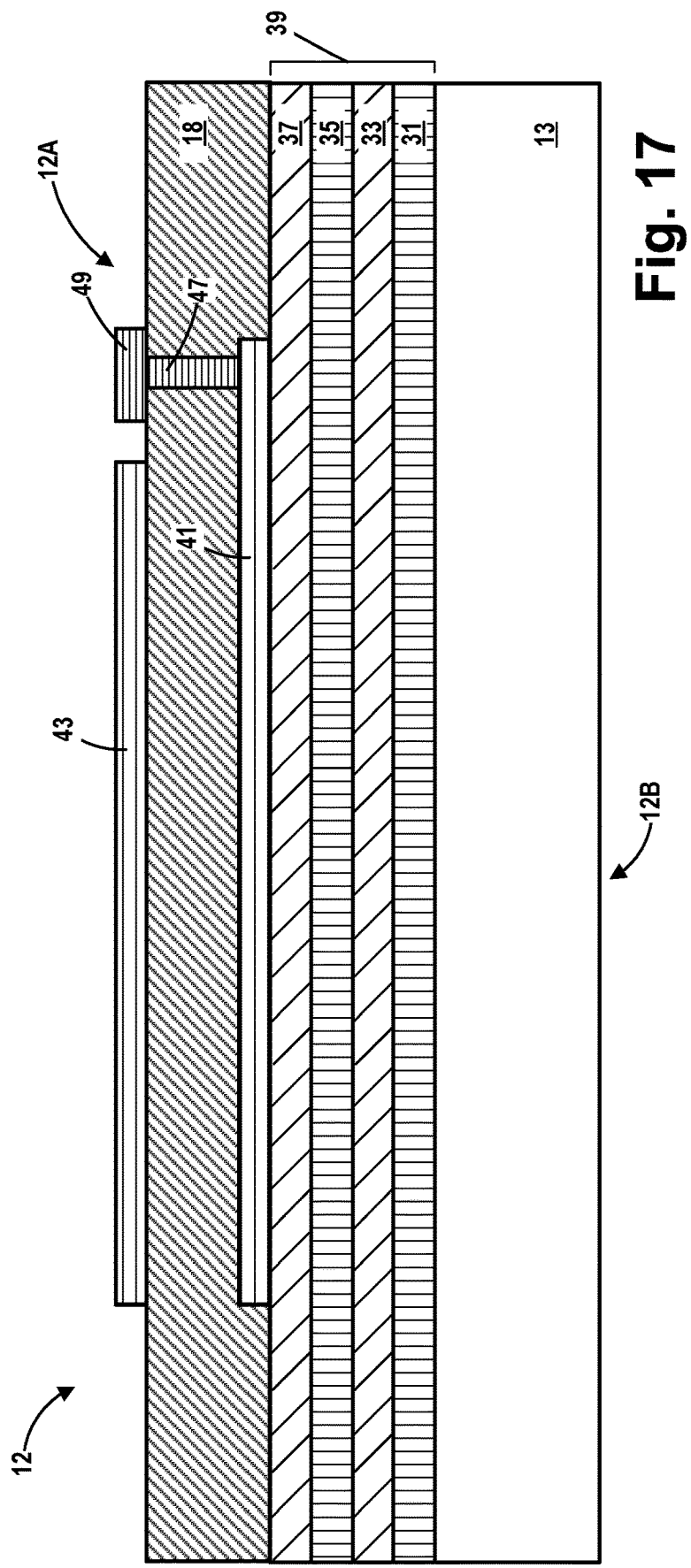
FIG. 17 depicts the RF filter wafer after a top electrode for the RF filter was formed and after a conductive pad was formed that is conductively coupled to the conductive via.

FIG. 17 depicts the RF filter wafer 12 after several process operations were performed to, among other things, form a top electrode 43 for the RF filter 16 and a pad 49 that is conductively coupled to the via 47. First, conductive material for both the top electrode 43 and the pad 49 was blanket-deposited across the entire front side 12A of the RF filter wafer 12 above the layer of piezoelectric material 18. The composition and thickness of the top electrode 43 as well as the pad 49 may vary depending upon the particular application, and it may be made of the same material or a different material as that of the bottom electrode 41. In one illustrative embodiment, the top electrode 43 and the pad 49 may have a thickness of about 50-200 nm, and they may be comprised of a conductive material such as, for example, copper, aluminum, etc. Thereafter, an etching process was performed through a patterned etch mask (not shown), e.g., a patterned layer of photoresist material, to pattern the layer of conductive material and thereby form the top electrode 43 and the pad 49. The size of the top electrode 43 may vary depending upon the particular application. In one illustrative embodiment, when viewed from above, the top electrode 43 may have a generally rectangular or generally square configuration and its footprint (when viewed from above) may be less than the footprint of the bottom electrode 41. After the etching process was completed, the patterned etch mask was removed.

Figure 18:
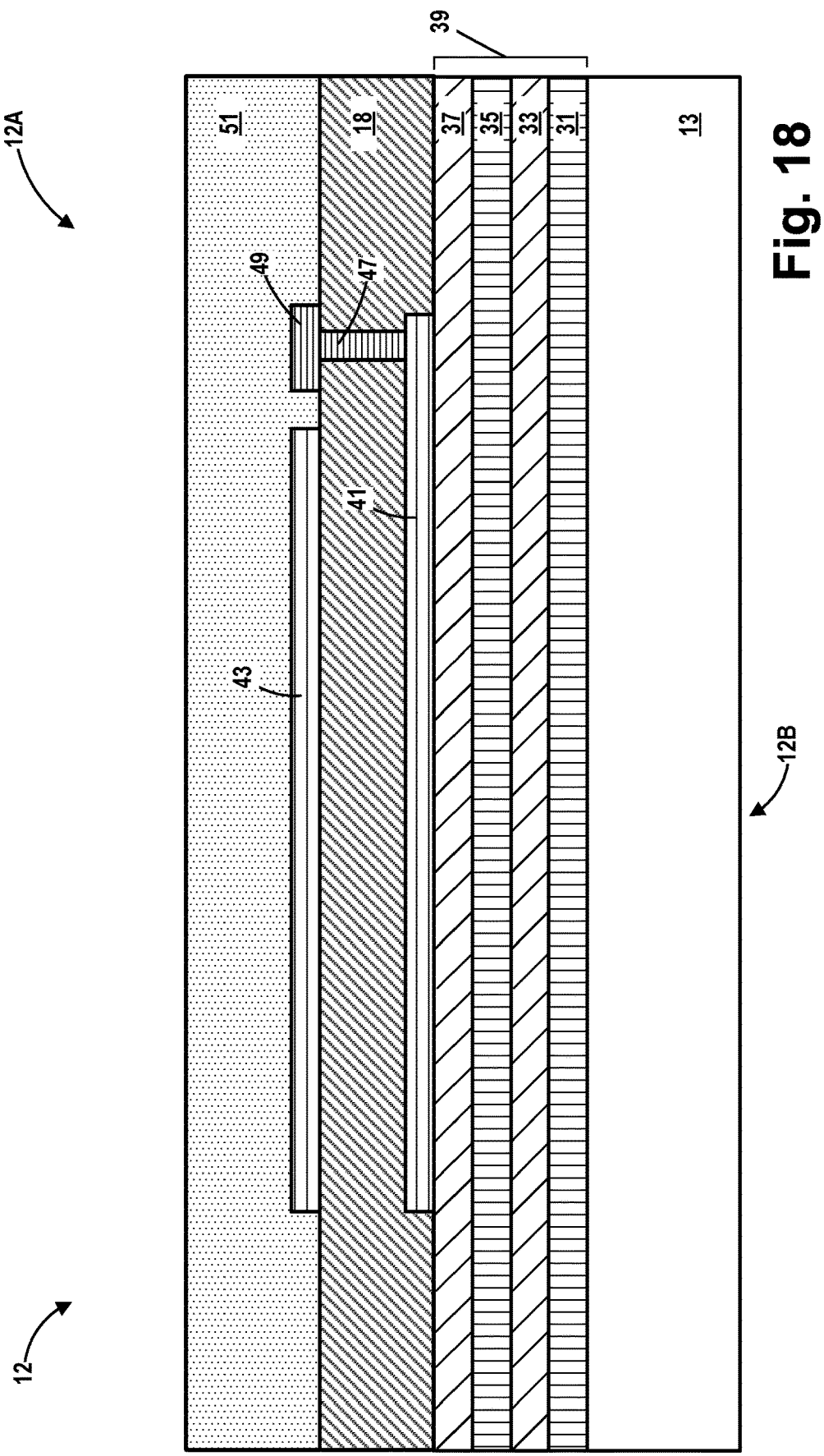
FIG. 18 depicts the RF filter wafer after a layer of insulating material was deposited above the top electrode.

FIG. 18 depicts the RF filter wafer 12 after a layer of insulating material 51 was deposited across the substrate and above the top electrode 42. The thickness and composition of the layer of insulating material 51 may vary depending upon the particular application. In one illustrative embodiment, the layer of insulating material 51 may be comprised of silicon dioxide. As initially formed, the layer of insulating material 51 may have an as-deposited upper surface that is non-planar. Thus, in one illustrative embodiment, a chemical mechanical polishing (CMP) process was performed to planarize the upper surface of the layer of insulating material 51.

FIG. 19 depicts the RF filter wafer 12 after several process operations were performed to form conductive vias 51A, 51B (collectively referred to using the numeral 51) and a plurality of conductive bond pads 53. In one illustrative process flow, a dual-damascene approach may be adopted whereby openings for both the vias 51 and the bond pads 53 may be formed in the layer of insulating material 51 by performing one or more etching processes through one or more patterned etch masks (not shown). Thereafter, the openings for the vias 51 and the bond pads 53 may be filled with conductive material. At that point, a CMP process may be performed to remove excess amounts of the conductive material. As depicted, the conductive via 51A is conductively coupled to the top electrode 43, while the conductive via 51B is conductively coupled to the bottom electrode 41 through the pad 49 and the via 47. At the conclusion of this process operation, the upper surfaces 53S of the conductive pads 53 are exposed, and the surfaces 53S are substantially co-planar with the surface 12S of the front side 12A of the RF filter wafer 12. The conductive pads 53 and vias 51 may be comprised of a variety of different materials, e.g., copper, tungsten, etc. At this point in the process flow, the manufacturing of the RF filter wafer 12 (with the illustrative BAW filter) is substantially complete and it is ready to be bonded to the TSV wafer 14, as described more fully below.

FIGS. 20-24 depict one illustrative technique for attaching the RF filter wafer 12 to the TSV wafer 14. In the examples shown in FIGS. 20-24, the RF filters 16 on the RF filter wafer 12 are illustrative SAW filters 16. However, as will be appreciated by those skilled in the art, the techniques described below would apply equally to the case where the RF filters 16 on the RF filter wafer 12 are illustrative BAW filters 16.

FIG. 20 is a reduced-size version of FIG. 3 showing the TSV wafer 14 after it has been completely fabricated. FIG. 21 is a plan view showing the back side 14B of the TSV wafer 14 and the layer of insulating material 55—no attempt has been made in FIG. 21 to show the conductive TSV contacts 54X that are formed across the entire back side 14B of the TSV wafer 14.

Figure 23:
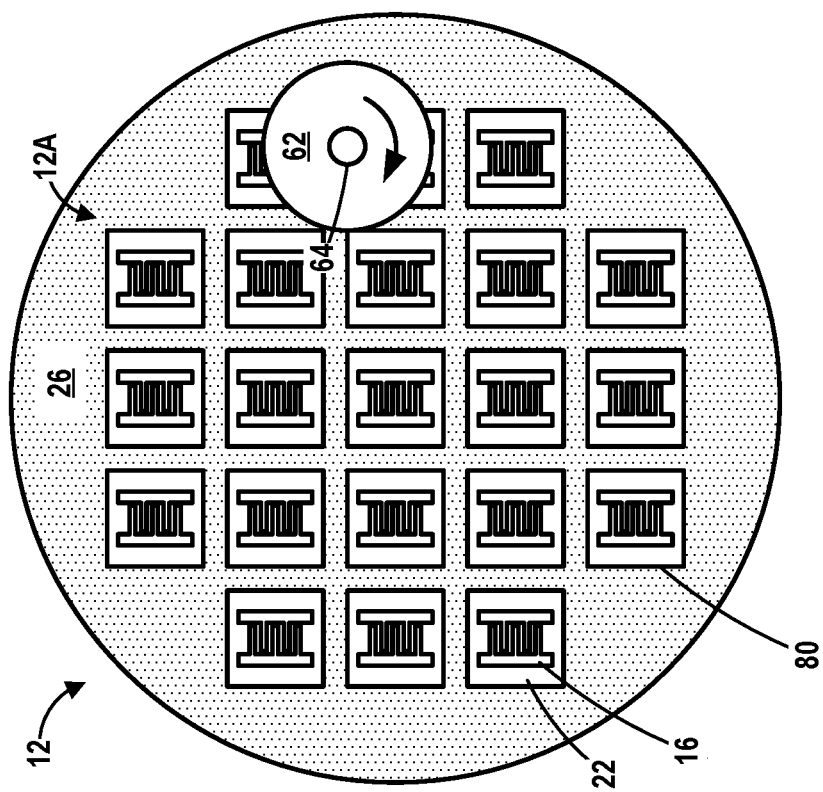
FIG. 23 is a plan view showing the front side of the RF filter wafer shown in FIG. 23.
Figure 22:
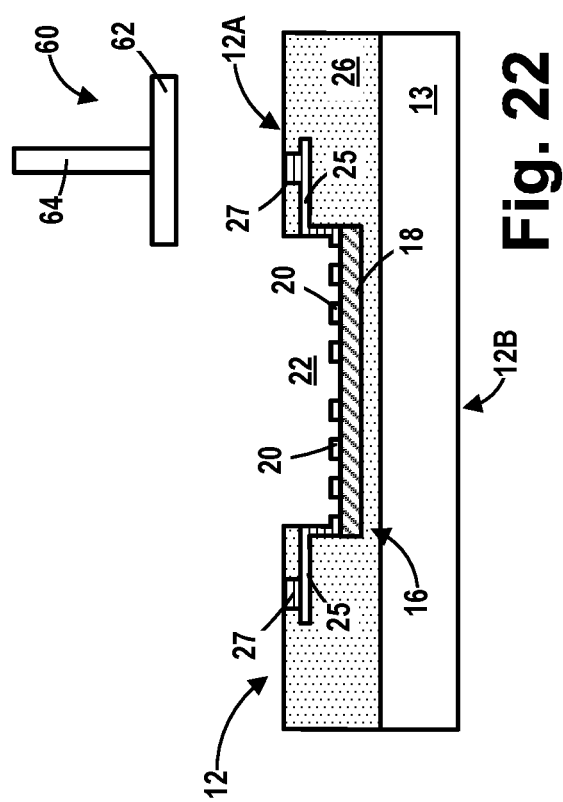
FIG. 22 is a reduced-size version of an illustrative embodiment of an RF filter wafer disclosed herein after it has been completely fabricated.

FIG. 22 is a reduced-size version of FIG. 12 showing the RF filter wafer 12 (comprised of a plurality of SAW filters) after it has been completely fabricated. FIG. 23 is a plan view showing the front side 12A of the RF filter wafer 12. As depicted in FIG. 23, a plurality of individual RF filter die 80 is formed above the front side 12A of the RF filter wafer 12. Each of the RF filter die 80 includes an open filter cavity 22 having at least a portion of a simplistically depicted SAW RF filter 16 positioned therein. Also depicted in FIGS. 22 and 23 is the insulating material 26. No attempt has been made to show the conductive pads 27 in FIG. 23. Note that the open filter cavities 22 in each of the RF filter die 80 on the RF filter wafer 12 remain open at this point in the process flow.

With reference to FIGS. 20-23, the RF filter wafer 12 and the TSV wafer 14 are bonded to one another using well-known wafer-to-wafer hybrid bonding techniques. As depicted in these drawings, both the front side 12A of the RF filter wafer 12 and the back side 14B of the TSV wafer 14 are subjected to a soft-pad CMP process using a schematically depicted CMP process tool 60 comprised of a pad 62 and a shaft 64. The duration and parameters of the CMP process operations performed on the front side 12A of the RF filter wafer 12 and the back side 14B of the TSV wafer 14 may vary depending upon the particular application.

Figure 24:
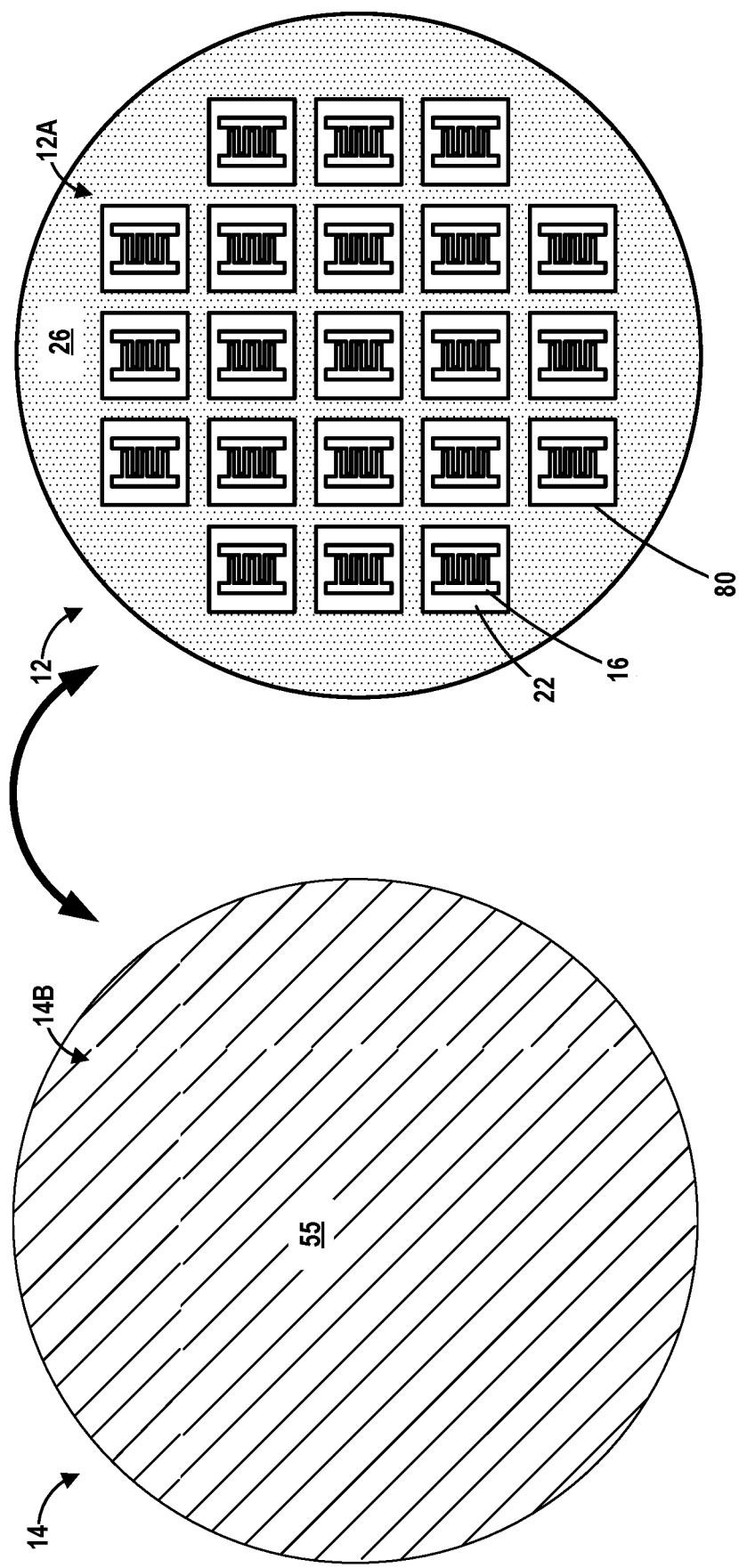
FIG. 24 depicts one illustrative technique disclosed herein for bonding one illustrative embodiment of an RF filter wafer disclosed herein to one illustrative embodiment of a TSV wafer disclosed herein.

With reference to FIG. 24, after the RF filter wafer 12 and the TSV wafer 14 have been subjected to the above-described soft polishing processes, the back side 14B of the TSV wafer 14 was urged into contact with the front side 12A of the RF filter wafer 12 (as indicated by the double arrow in FIG. 24). During this process, the conductive bond pads (e.g., 27 or 53) on the RF filter wafer 12 are conductively coupled to corresponding conductive TSV contacts 54X positioned on the back side of the TSV wafer 14. Thereafter, the combination of the TSV wafer 14 and the RF filter wafer 12 was subjected to a surface activating nitrogen plasma process performed at room temperature and a relatively low-temperature anneal process (e.g., 350° C. for a duration of about one hour) so as to cause the TSV wafer 14 and the RF filter wafer 12 to bond with one another. Thereafter, the organic glue material 52 and the handle wafer (or substrate) 50 were removed from the TSV wafer 14. Note that attaching the RF filter wafer 12 and the TSV wafer 14 to one another effectively seals off the open filter cavity 22 in each of the RF filter die 80 on the RF filter wafer 12, thereby providing a sealed environment above the RF filter 16. In the situation where the RF filters 16 are BAW filters, the filter cavities 22 are not present. After the wafer bonding process is completed, the bonded combination of the RF filter wafer 12 and the TSV wafer 14 may be diced, i.e., cut or singulated, into the individual products 10 shown in FIG. 1 (comprised of an RF filter die 80 and an active TSV die 82). Additional packaging materials may be formed for the product 10 as needed.

Note that using the methods disclosed herein, in one illustrative example, the RF filter die 80 is stacked or positioned on the back of the active TSV die 82. This arrangement reduces the path for the RF signal to travel, thereby minimizing transmission losses. This stacked arrangement of the RF filter die 80 and the active TSV die 82 also reduces the packaging footprint of the overall product.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:
1. A product, comprising:
 an RF filter die comprising;
  an RF filter;
  a front side;
  a plurality of conductive bond pads that are conductively coupled to at least a portion of said RF filter, wherein at least a portion of each of said plurality of conductive bond pads is exposed on said front side of said RF filter die;
  a first layer of insulating material with a substantially planar surface, wherein said substantially planar surface of said first layer of insulating material forms at least a portion of said front side of said RF filter die and wherein said conductive bond pads have a surface that is substantially planar with said substantially planar surface of said first layer of insulating material on said front side of said RF filter; and a TSV (Through-Substrate-Via) die comprising:
- a front side and a back side, said back side being opposite said front side of said TSV die;
- a plurality of conductive TSV contacts positioned on said back side of said TSV die;
- at least one conductive TSV (Through-Substrate-Via) structure that is conductively coupled to at least one of said plurality of conductive TSV contacts, wherein said back side of said TSV die is bonded to said front side of said RF filter die and said conductive bond pads on said RF filter die are conductively coupled to corresponding conductive TSV contacts positioned on said back side of said TSV die; and
- a second layer of insulating material with a substantially planar surface, wherein said substantially planar surface of said second layer of insulating material forms at least a portion of said back side of said TSV die and wherein said plurality of conductive TSV contacts have a substantially planar surface that is substantially planar with said substantially planar surface of said second layer of insulating material on said back side of said TSV die.

2. The product of claim 1, wherein said front side of said RF filter die comprises the first layer of insulating material with the substantially planar surface without any filter cavities formed therein.

3. The product of claim 2, wherein said RF filter comprises a Bulk Acoustic Wave (BAW) filter that comprises:
- a first electrode;
- a layer of a piezoelectric material positioned on said first electrode; and
- a second electrode positioned on said layer of piezoelectric material, wherein said first layer of insulating material is positioned above and covers said second electrode.

4. The product of claim 1, wherein said front side of said RF filter die further comprises a filter cavity formed in the first layer of insulating material, wherein said filter cavity exposes at least a portion of said RF filter, and wherein said second layer of insulating material of said back side of said TSV die is bonded to said first layer of insulating material of said front side of said RF filter so as to seal said filter cavity.

5. The product of claim 4, wherein said RF filter comprises a Surface Acoustic Wave (SAW) filter that comprises:
- a layer of a piezoelectric material; and
- a plurality of interdigitated electrical conductive traces (IDTs) positioned on said layer of piezoelectric material, wherein at least a portion of at least some of said plurality of interdigitated electrical conductive traces and at least a portion of said layer of piezoelectric material are exposed within said filter cavity.

6. The product of claim 1, wherein said RF filter die further comprises a plurality of conductive vias that conductively couple said conductive bond pads to said RF filter.

7. The product of claim 1, further comprising a plurality of conductive lines that conductively couple said conductive bond pads to said RF filter.

8. Aft Surface Acoustic Wave (SAW) filter die, comprising:
- a front side that comprises an insulating material with a substantially planar surface, wherein said substantially planar surface of said insulating material forms at least a portion of said front side of said RF filter die;
- a Surface Acoustic Wave (SAW) filter comprising:
  - a layer of a piezoelectric material; and
  - a plurality of interdigitated electrical conductive traces (IDTs) positioned on said layer of piezoelectric material;
- a filter cavity open to said front side of said RF filter die, said filter cavity exposing at least a portion of said Surface Acoustic Wave (SAW) filter, wherein at least a portion of at least some of said plurality of interdigitated electrical conductive traces (IDTs) and at least a portion of said layer of piezoelectric material are exposed within said filter cavity; and
- a plurality of conductive bond pads that are conductively coupled to at least a portion of said Surface Acoustic Wave (SAW) filter, wherein said conductive bond pads have a substantially planar surface that is substantially planar with said substantially planar surface of said insulating material such that at least a portion of each of said plurality of conductive bond pads is exposed on said front side of said Surface Acoustic Wave (SAW) filter die.

9. A method, comprising:
- forming an RF filter wafer comprising a plurality of RF filter die and a front side, each of said RF filter die comprising an RF filter and a plurality of conductive bond pads that are conductively coupled to said RF filter;
- forming a TSV (Through-Substrate-Via) wafer comprising a plurality of TSV (Through-Substrate-Via) die and a plurality of conductive TSV contacts positioned on a back side of said TSV wafer, each of said plurality of TSV die comprising at least one conductive TSV (Through-Substrate-Via) structure that is conductively coupled to at least one of said plurality of conductive TSV contacts, wherein each of said TSV die comprise a plurality of transistor devices formed on a front side of said TSV die; and
- bonding said front side of said RF filter wafer to said back side of said TSV wafer such that said conductive bond pads on said RF filter die are conductively coupled to corresponding conductive TSV contacts positioned on said back side of said TSV die.

10. The method of claim 9, wherein said front side of said RF filter die further comprises a first layer of insulating material with a filter cavity formed therein and said back side of said TSV comprises a second layer of insulating material, wherein said filter cavity exposes at least a portion of said RF filter, and wherein the method further comprises bonding said second layer of insulating material of said back side of said TSV die to said first layer of insulating material of said front side of said RF filter so as to seal said filter cavity.

11. The method of claim 9, further comprising cutting a combination of said bonded RF filter wafer and said TSV wafer into a plurality of individual sections, each of said sections comprising an RF filter die and a TSV die.

12. The method of claim 9, wherein said RF filter comprises one of a Bulk Acoustic Wave (BAW) filter and a Surface Acoustic Wave (SAW) filter.

* * * * *

UNITED STATES PATENT AND TRADEMARK OFFICE
CERTIFICATE OF CORRECTION

PATENT NO. : 10,636,776 B2
APPLICATION NO. : 15/907413
DATED : April 28, 2020
INVENTOR(S) : Md. Sayed Kaysar Bin Rahim et al.

Page 1 of 1

It is certified that error appears in the above-identified patent and that said Letters Patent is hereby corrected as shown below:

In the Claims

Column 13, Line 59 (Claim 8, Line 1), change "Aft Surface" to -- A Surface --.

Signed and Sealed this
Ninth Day of June, 2020

Andrei Iancu
*Director of the United States Patent and Trademark Office*